US010003357B2

(12) United States Patent
Richardson et al.

(10) Patent No.: US 10,003,357 B2
(45) Date of Patent: Jun. 19, 2018

(54) SYSTEMS AND METHODS FOR VERIFICATION OF CODE RESILIENCY FOR DATA STORAGE

(71) Applicant: QUALCOMM Incorporated, San Diego, CA (US)

(72) Inventors: Thomas Joseph Richardson, South Orange, NJ (US); Michael George Luby, Berkeley, CA (US); Mahdi Cheraghchi Bashi Astaneh, Cleveland, OH (US); Lorenz Christoph Minder, Evanston, IL (US)

(73) Assignee: QUALCOMM Incorporated, San Diego, CA (US)

( * ) Notice: Subject to any disclaimer, the term of this patent is extended or adjusted under 35 U.S.C. 154(b) by 160 days.

(21) Appl. No.: 14/954,609

(22) Filed: Nov. 30, 2015

(65) Prior Publication Data
US 2017/0063397 A1   Mar. 2, 2017

Related U.S. Application Data

(60) Provisional application No. 62/211,243, filed on Aug. 28, 2015.

(51) Int. Cl.
*H03M 13/00* (2006.01)
*H03M 13/15* (2006.01)
(Continued)

(52) U.S. Cl.
CPC .......... *H03M 13/154* (2013.01); *G06F 3/064* (2013.01); *G06F 3/0619* (2013.01);
(Continued)

(58) Field of Classification Search
CPC ............... G06F 11/008; G06F 11/1076; G06F 11/1088; G06F 3/0619; G06F 3/064;
(Continued)

(56) References Cited

U.S. PATENT DOCUMENTS 7,818,430 B2   10/2010  Zuckerman et al.
8,788,913 B1    7/2014  Xin et al.
(Continued)

FOREIGN PATENT DOCUMENTS

WO    WO-2009129054 A2    10/2009

OTHER PUBLICATIONS

Lopes J., et al., "Stopping a Rapid Tornado with a Puff," IEEE Symposium on Security and Privacy (SP), 2014, pp. 509-523.
(Continued)

*Primary Examiner* — Albert Decady
*Assistant Examiner* — Osman M Alshack
(74) *Attorney, Agent, or Firm* — Norton Rose Fulbright LLP

(57) ABSTRACT

Systems and methods which implement forward checking of data integrity are disclosed. A storage system of embodiments may, for example, comprise data integrity forward checking logic which is operable to perform forward checking of data integrity in real-time or near real-time to check that a number of node failures can be tolerated without loss of data. Embodiments may be utilized to provide assurance that a number of fragments needed for source data recovery will be available for the source objects most susceptible to failure when a certain number of additional fragments are lost, such as due to storage node failures.

74 Claims, 6 Drawing Sheets

(51) Int. Cl.
*G06F 11/10* (2006.01)
*G06F 3/06* (2006.01)
*G06F 11/14* (2006.01)
*G06F 17/30* (2006.01)

(52) U.S. Cl.
CPC ........ *G06F 3/0683* (2013.01); *G06F 11/1076* (2013.01); *G06F 11/1092* (2013.01); *G06F 11/1469* (2013.01); *G06F 17/30371* (2013.01); *G06F 17/30598* (2013.01); *G06F 2201/84* (2013.01)

(58) Field of Classification Search
CPC ............... G06F 3/0683; G06F 11/1092; G06F 11/1469; G06F 17/30371; G06F 17/30598; G06F 2201/84; H03M 13/154
USPC .......................... 714/763, 769, 770, 773, 799
See application file for complete search history.

(56) References Cited

U.S. PATENT DOCUMENTS

| | | | |
|---|---|---|---|
| 9,075,773 B1 | 7/2015 | Rakitzis et al. | |
| 2004/0128587 A1* | 7/2004 | Kenchammana-Hosekote | G06F 11/0727 714/43 |
| 2007/0245083 A1* | 10/2007 | Margolus | G06F 11/1096 711/114 |
| 2008/0201428 A1* | 8/2008 | Dubnicki | G06F 17/30067 709/205 |
| 2010/0094950 A1* | 4/2010 | Zuckerman | H04L 67/1008 709/213 |
| 2011/0029840 A1* | 2/2011 | Ozzie | G06F 11/1004 714/763 |
| 2011/0299629 A1 | 12/2011 | Luby et al. | |
| 2012/0099593 A1 | 4/2012 | Luby | |
| 2012/0198195 A1* | 8/2012 | Wylie | G06F 11/1076 711/170 |
| 2013/0166768 A1* | 6/2013 | Gouache | H04L 65/00 709/231 |
| 2013/0254634 A1 | 9/2013 | Luby et al. | |
| 2013/0290361 A1* | 10/2013 | Anderson | G06F 17/30575 707/758 |
| 2014/0317222 A1* | 10/2014 | Li | H04L 67/1097 709/213 |
| 2014/0380126 A1* | 12/2014 | Yekhanin | G06F 11/10 714/766 |
| 2015/0142863 A1* | 5/2015 | Yuen | H03M 13/13 707/827 |
| 2017/0060700 A1 | 3/2017 | Richardson et al. | |

OTHER PUBLICATIONS

International Search Report and Written Opinion—PCT/US2016/039635—ISA/EPO—dated Sep. 28, 2016 (153952U1WO).

* cited by examiner

SYSTEMS AND METHODS FOR VERIFICATION OF CODE RESILIENCY FOR DATA STORAGE

CROSS-REFERENCE TO RELATED APPLICATIONS

This application claims the benefit of U.S. Provisional Patent Application No. 62/211,243, entitled, "SYSTEMS AND METHODS FOR VERIFICATION OF CODE RESILIENCY FOR DATA STORAGE", filed on Aug. 28, 2015, which is expressly incorporated by reference herein in its entirety.

DESCRIPTION OF THE RELATED ART

The creation, management, storage, and retrieval of electronic data has become nearly ubiquitous in the day-to-day world. Such electronic data may comprise various forms of information, such as raw data (e.g., data collected from sensors, monitoring devices, control systems, etc.), processed data (e.g., metrics or other results generated from raw data, data aggregations, filtered data, etc.), produced content (e.g., program code, documents, photographs, video, audio, etc.), and/or the like. Such data may be generated by various automated systems (e.g., network monitors, vehicle on-board computer systems, automated control systems, etc.), by user devices (e.g., smart phones, personal digital assistants, personal computers, digital cameras, tablet devices, etc.), and/or a number of other devices.

Regardless of the particular source or type of data, large quantities of electronic data are generated, stored, and accessed every day. Accordingly sophisticated storage systems, such as network attached storage (NAS), storage area networks (SANs), and cloud based storage (e.g., Internet area network (IAN) storage systems), have been developed to provide storage of large amounts of electronic data. Such storage systems provide a configuration in which a plurality of storage nodes are used to store the electronic data of one or more users/devices, and which may be stored and retrieved via one or more access servers.

FIG. 1A shows an exemplary implementation of storage system 100A in which access server 110 is in communication with end user (EU) device 120 to provide storage services with respect thereto. Access server 110 may comprise one or more servers operable under control of an instruction set to receive data from devices such as EU device 120, and to control storage of the data and to retrieve data in response to requests from devices such as EU device 120. Accordingly, access server 110 is further in communication with a plurality, M, of storage nodes (shown here as storage nodes 130-1 through 130-M).

Storage nodes 130-1 through 130-M may comprise a homogeneous or heterogeneous collection or array (e.g., redundant array of independent disks (RAID) array) of storage media (e.g., hard disk drives, optical disk drives, solid state drives, random access memory (RAM), flash memory, etc.) providing persistent memory in which the electronic data is stored by and accessible through access server 110. Each such storage node may be, for example, a commodity web server. Alternatively, in some deployments at least some storage nodes may be personal devices interconnected over the Internet. EU device 120 may comprise any configuration of device which operates to generate, manage, and/or access electronic data. It should be appreciated that although only a single such device is shown, storage system 100A may operate to serve a plurality of devices, some or all of which may comprise devices in addition to or in the alternative to devices characterized as "end user" devices.

FIG. 1B shows an exemplary implementation of storage system 100B in which access servers 110-1 through 110-14 may communicate with one or more EU devices of EU devices 120-1 through 120-3 to provide storage services with respect thereto. It should be appreciated that storage system 100B shows an alternative configuration to that of 100A discussed above wherein, although the access servers, EU devices, and storage nodes may be embodied as described above, the storage nodes of storage system 110B are deployed in a cluster configuration, shown as storage node cluster 130. In operation of storage system 100B, a cluster of access servers have access to the cluster of storage nodes. Thus, the EU devices may connect in a variety of ways to various access servers to obtain data services. In some cases, the access servers may be distributed around the country such that no matter where the EU device is located it may access the data stored in the storage node cluster. Storage nodes of such a configuration may be distributed geographically as well.

Source blocks of electronic data are typically stored in storage systems such as storage systems 100A and 100B as objects. Such source blocks, and thus the corresponding objects stored by the storage systems, may comprise individual files, collections of files, data volumes, data aggregations, etc. and may be quite large (e.g., on the order of megabytes, gigabytes, terabytes, etc.). The objects are often partitioned into smaller blocks, referred to as fragments (e.g., a fragment typically consisting of a single symbol), for storage in the storage system. For example, an object may be partitioned into k equal-sized fragments (i.e., the fragments comprise blocks of contiguous bytes from the source data) for storage in storage systems 100A and 100B. Each of the k fragments may, for example, be stored on a different one of the storage nodes.

In operation, storage systems such as storage systems 100A and 100B are to provide storage of and access to electronic data in a reliable and efficient manner. For example, in a data write operation, access server 110 may operate to accept data from EU device 120, create objects from the data, create fragments from the objects, and write the fragments to some subset of the storage nodes. Correspondingly, in a data read operation, access server 110 may receive a request from EU device 120 for a portion of stored data, read appropriate portions of fragments stored on the subset of storage nodes, recreate the object or appropriate portion thereof, extract the requested portion of data, and provide that extracted data to EU device 120. However, the individual storage nodes are somewhat unreliable in that they can intermittently fail, in which case the data stored on them is temporarily unavailable, or permanently fail, in which case the data stored on them is permanently lost (e.g., as represented by the failure of storage node 130-2 in FIG. 1C).

Erasure codes (e.g., tornado codes, low-density parity-check codes, Reed-Solomon coding, and maximum distance separable (MDS) codes) have been used to protect source data against loss when storage nodes fail. When using an erasure code, such as MDS erasure codes, erasure encoding is applied to each source fragment (i.e., the k fragments into which an object is partitioned) of an object to generate repair data for that fragment, wherein the resulting repair fragments are of equal size with the source fragments. In operation of the storage system, the source fragments and corresponding repair fragments are each stored on a different one of the storage nodes.

The erasure code may provide r repair fragments for each source object, whereby the total number of fragments, n, for a source object may be expressed as n=k+r. Thus, the erasure code may be parameterized as (n; k; r) where k is the number of source symbols in a source block, n is the total number of encoded symbols, and r=n−k is the number of repair symbols. A property of MDS erasure codes is that all k source symbols can be recovered from any k of the n encoded symbols (i.e., the electronic data of the source block may be retrieved by retrieving any combination (source and/or repair fragments) of k fragments. Although providing data reliability, it should be appreciated that where desired data is not directly available (e.g., a fragment is unavailable due to a failed storage node), to recreate the missing data k fragments must be accessed to recreate the missing data (i.e., k times the amount of data must be accessed to recreate the desired but missing data). This can result in inefficiencies with respect to the use of resources, such as communication bandwidth, computing resources, etc.

In providing reliable storage of the electronic data, storage systems such as storage systems 100A and 100B implementing erasure coding of the data (e.g., access server 110 of FIG. 1C operational to provide repair server functionality) have a repair process or policy running in the background to determine the number of fragments available with respect to the objects (e.g., to detect objects which are missing one or more fragments, such as due to a failed storage node). For objects with some level of missing fragments (e.g., as the number of available fragments approaches k) logic of the storage system repair process will read k remaining fragments for that object and recreate the object and write additional fragments to the storage system (e.g., on other of the storage nodes which remain available). Typically, the objects for which the fewest fragments are available are the ones that are repaired first, before objects that have more fragments available (assuming an equal number of fragments for the objects), according to such repair policies.

It should be appreciated that, although the example of FIG. 1C illustrates a repair server as being implemented by access server 110, repair servers operable to provide repair services herein may be provided in various configurations. For example, one or more repair servers may be provided separately from access servers of a storage system according to embodiments. As another example, repair servers and or access servers may be implemented by storage nodes 130-1 through 130-M.

The aforementioned intermittent node failures are far more typical than permanent node failures (e.g., 90% of the node failures are intermittent), and the repair policy is not needed to recover the data that is temporarily unavailable on these nodes as eventually this data will become available again when the node comes back online. Accordingly, when fragments become unavailable the repair process may detect and delay repairing the data for some period of time, T (e.g., intermittent failure threshold time), to determine whether the failure is intermittent or permanent.

The erasure code solutions that have been implemented with respect to storage systems have been small erasure code solutions due to their suitability for relatively rapid recreation of missing source data. An (n; k; r) erasure code solution is said to be a small erasure code solution if n<<M (i.e., for each source object there are fragments at a small fraction of the storage nodes). Such a small erasure code configuration (e.g., k=10) generally comprises a correspondingly small number of repair fragments (e.g., r=4, thus n=14). Accordingly, for a small erasure code solution it is beneficial to use a reactive repair policy (i.e., when a fragment of an object is lost due to a permanent node failure then the repair policy immediately or as quickly as possible replaces the lost fragment with another fragment in light of the total number of fragments, n, being so near the minimum number of fragments, k, needed to recover the data). Because a large amount of data is stored on each node (typically many terabytes), and all data comprising fragments stored on a node typically needs to be replaced when the node permanently fails, the repair process reads and writes a large amount of data after a node permanently fails. This reading and writing of large amounts of data generally results in the consumption of large amounts of bandwidth in the storage system by the repair policy and, when coupled with a reactive repair policy, can result in disruptive spikes in storage system bandwidth utilization (e.g., delaying or preventing primary data access services by the storage system). That is, the repair policy implemented with respect to a small erasure code configuration may act somewhat erratically whereby it utilizes a large amount of bandwidth for periods of time when attempting to repair data immediately upon determining fragments are unavailable due to a permanently failed node. Furthermore, the repair process may not be able to repair fragments fast enough before further node failures lead to permanent loss of object data if not enough bandwidth is allocated to the repair process.

SUMMARY

A method implemented by processor-based logic of a storage system storing source objects as a plurality of erasure coded fragments is provided according to embodiments herein. The method of embodiments includes obtaining, by the logic of the storage system, a prospective number of fragment losses (L) for verifying source data integrity with respect to the storage system. Embodiments of the method further include determining, by the logic of the storage system, a set of erasure coded fragments commonly available for one or more source objects stored by the storage system, and analyzing, by the logic of the storage system, a plurality of combinations of loss of the prospective number of fragments from the commonly available set of erasure coded fragments to verify data integrity in the storage system, whereby it is determined whether the storage system is susceptible to source data loss due to a loss of L erasure coded fragments.

An apparatus for analyzing source objects stored by a storage system as a plurality of erasure coded fragments is provided according to further embodiments herein. The apparatus of embodiments includes one or more data processors and one or more non-transitory computer-readable storage media containing program code configured to cause the one or more data processors to perform particular operations. The operations performed according to embodiments include obtaining a prospective number of fragment losses (L) for verifying source data integrity with respect to the storage system. The operations performed according to embodiments further include determining a set of erasure coded fragments commonly available for one or more source objects stored by the storage system, and analyzing a plurality of combinations of loss of the prospective number of fragments from the commonly available set of erasure coded fragments to verify data integrity in the storage system, whereby it is determined whether the storage system is susceptible to source data loss due to a loss of L erasure coded fragments.

An apparatus for analyzing source objects stored by a storage system as a plurality of erasure coded fragments is provided according to still further embodiments herein. The apparatus of embodiments includes means for obtaining a prospective number of fragment losses (L) for verifying source data integrity with respect to the storage system. The apparatus of embodiments further includes means for determining a set of erasure coded fragments commonly available for one or more source objects stored by the storage system, and means for analyzing a plurality of combinations of loss of the prospective number of fragments commonly from the available set of erasure coded fragments to verify data integrity in the storage system, whereby it is determined whether the storage system is susceptible to source data loss due to a loss of L erasure coded fragments.

A non-transitory computer-readable medium comprising codes for analyzing source objects stored by a storage system as a plurality of erasure coded fragments is provided according to yet further embodiments herein. The codes of embodiments cause a computer to obtain a prospective number of fragment losses (L) for verifying source data integrity with respect to the storage system. The codes of embodiments further cause a computer to determine a set of erasure coded fragments commonly available for one or more source objects stored by the storage system, and analyze a plurality of combinations of loss of the prospective number of fragments from the commonly available set of erasure coded fragments to verify data integrity in the storage system, whereby it is determined whether the storage system is susceptible to source data loss due to a loss of L erasure coded fragments.

A method implemented by processor-based logic of a storage system storing source objects as a plurality of erasure coded fragments is provided according to embodiments herein. The method of embodiments includes determining, by the logic of the storage system, a set of erasure coded fragments commonly available for one or more source objects stored by the storage system and partitioning, by the logic of the storage system, the set of erasure coded fragments commonly available for one or more source objects into a number of (g) groups of fragments. Embodiments of the method further include obtaining, by the logic of the storage system, a prospective number of losses (L) of groups of fragments for verifying source data integrity with respect to the storage system, and analyzing, by the logic of the storage system, a plurality of combinations of loss of the prospective number of groups of fragments from the g groups of fragments, whereby it is determined whether the storage system is susceptible to source data loss due to a loss of L of the g groups of fragments.

An apparatus for analyzing source objects stored by a storage system as a plurality of erasure coded fragments is provided according to further embodiments herein. The apparatus of embodiments includes one or more data processors and one or more non-transitory computer-readable storage media containing program code configured to cause the one or more data processors to perform operations. The operations performed according to embodiments include determining a set of erasure coded fragments commonly available for one or more source objects stored by the storage system and partitioning the set of erasure coded fragments commonly available for one or more source objects into a number of (g) groups of fragments. The operations performed according to embodiments further include obtaining a prospective number of losses (L) of groups of fragments for verifying source data integrity with respect to the storage system and analyzing a plurality of combinations of loss of the prospective number of groups of fragments from the g groups of fragments, whereby it is determined whether the storage system is susceptible to source data loss due to a loss of L of the g groups of fragments.

An apparatus for analyzing source objects stored by a storage system as a plurality of erasure coded fragments according to still further embodiments herein. The apparatus of embodiments includes means for determining a set of erasure coded fragments commonly available for one or more source objects stored by the storage system and means for partitioning the set of erasure coded fragments commonly available for one or more source objects into a number of (g) groups of fragments. Embodiments of the apparatus further include means for obtaining a prospective number of losses (L) of groups of fragments for verifying source data integrity with respect to the storage system and means for analyzing a plurality of combinations of loss of the prospective number of groups of fragments from the g groups of fragments, whereby it is determined whether the storage system is susceptible to source data loss due to a loss of L of the g groups of fragments.

A non-transitory computer-readable medium comprising codes for analyzing source objects stored by a storage system as a plurality of erasure coded fragments is provided according to yet further embodiments herein. The codes of embodiments causing the computer to determine a set of erasure coded fragments commonly available for one or more source objects stored by the storage system and partition the set of erasure coded fragments commonly available for one or more source objects into a number of (g) groups of fragments. Embodiments of the codes further causing the computer to obtain a prospective number of losses (L) of groups of fragments for verifying source data integrity with respect to the storage system and analyze a plurality of combinations of loss of the prospective number of groups of fragments from the g groups of fragments, whereby it is determined whether the storage system is susceptible to source data loss due to a loss of L of the g groups of fragments.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1A:
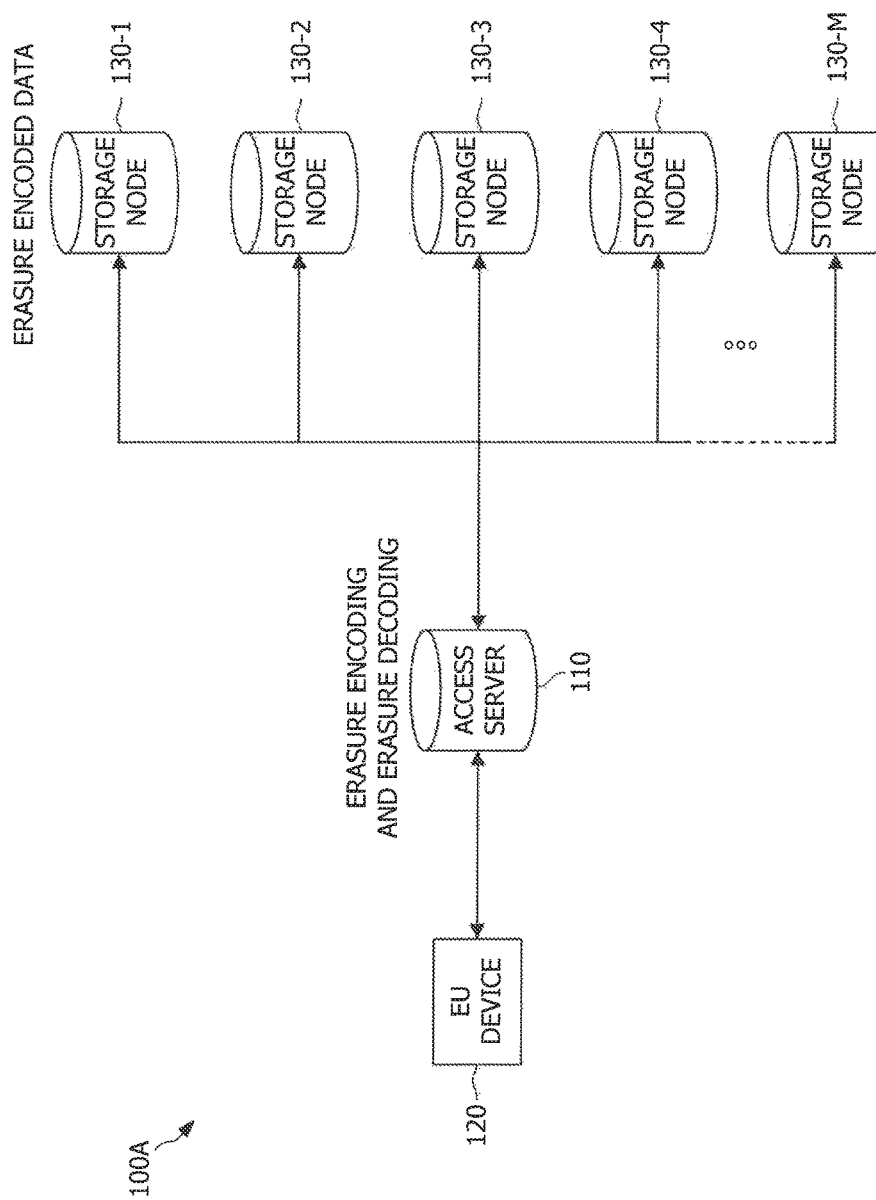
FIGS. 1A and 1B show exemplary implementations of storage systems as may be adapted to provide verification of code resiliency according to embodiments of the present disclosure.
Figure 1B:
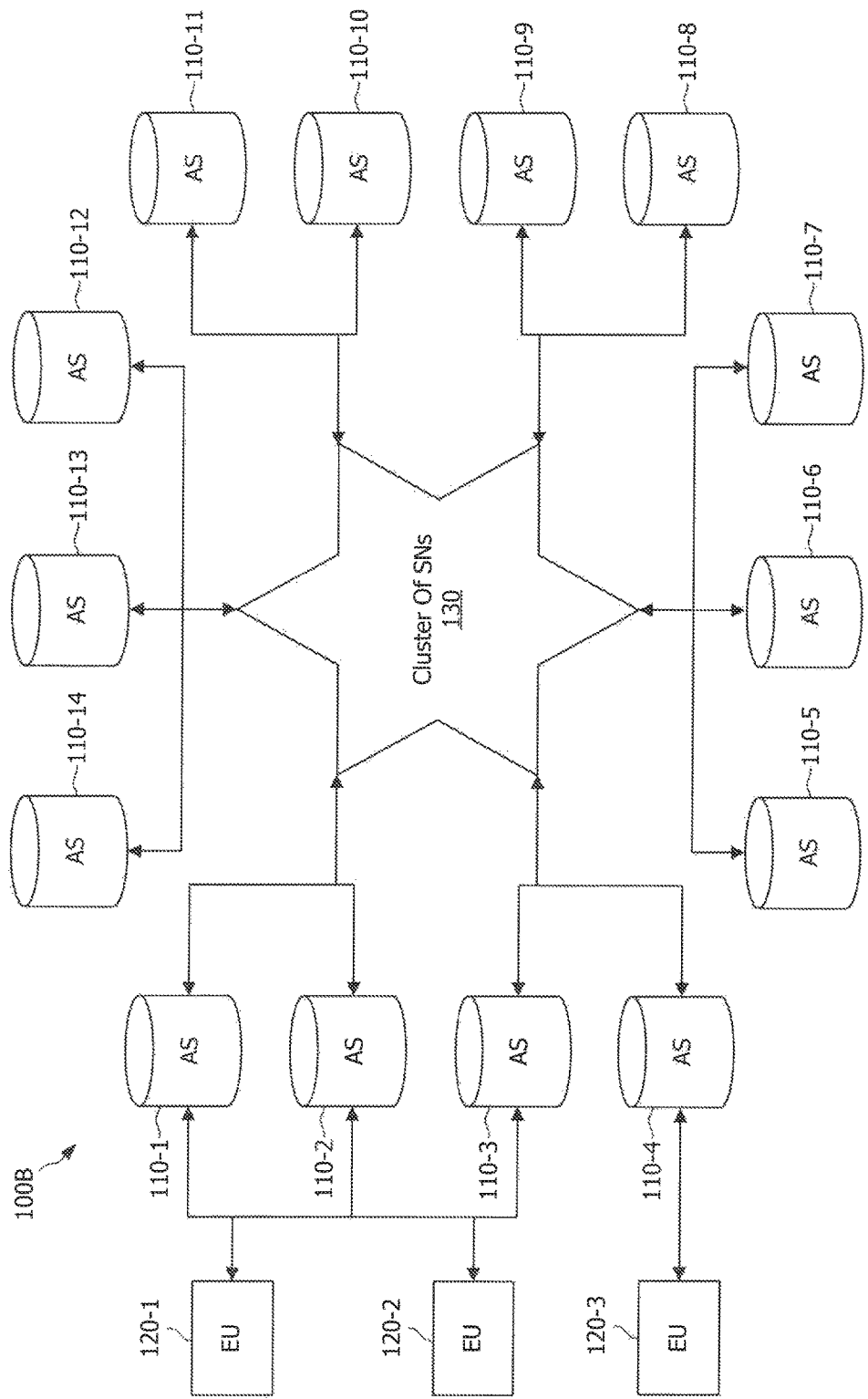
Figure 1C:
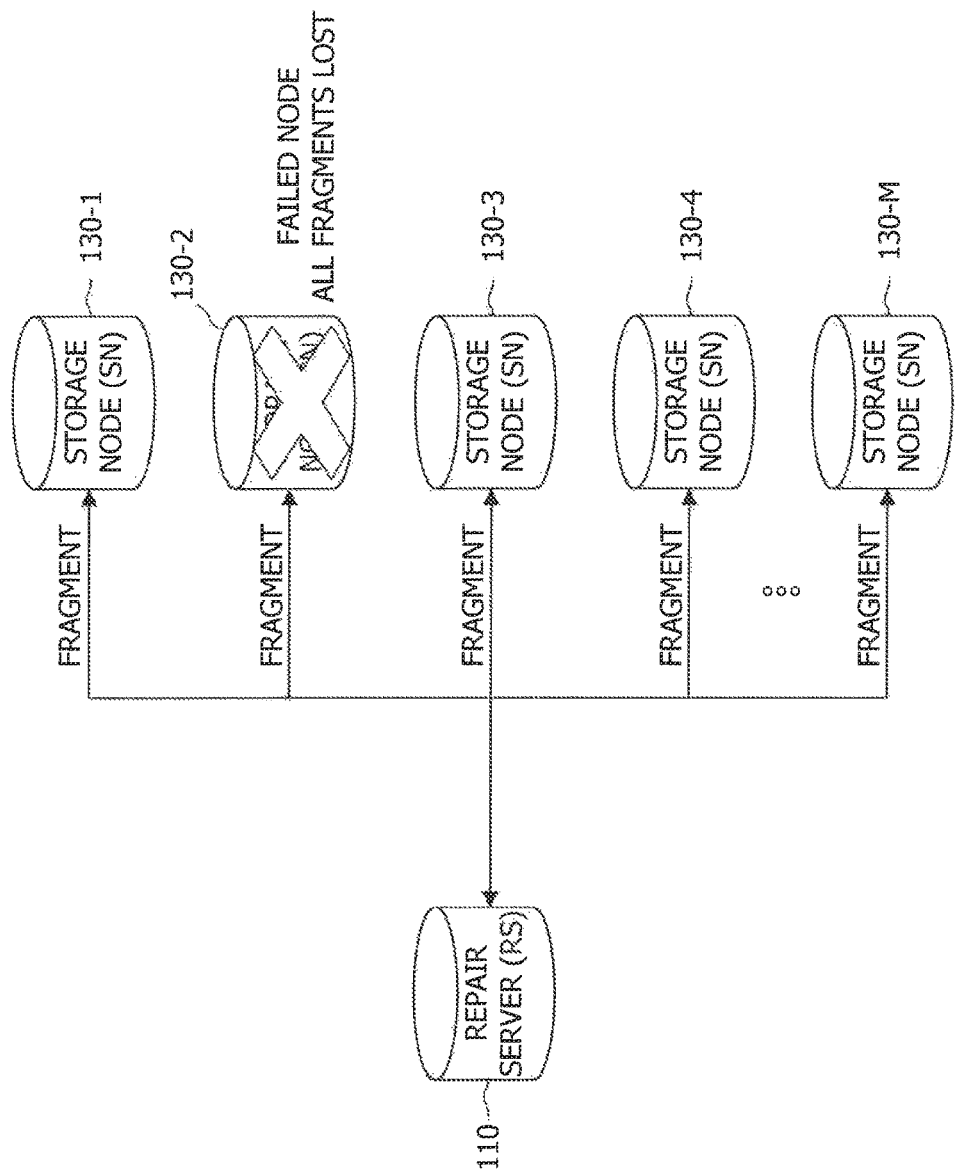
FIG. 1C shows failure of a storage node as may be experienced in the storage systems of FIGS. 1A and 1B.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

As used in this description, the terms "data" and "electronic data" may include information and content of various forms, including raw data, processed data, produced content, and/or the like, whether being executable or non-executable in nature. Such data may, for example, include data collected from sensors, monitoring devices, control systems, metrics or other results generated from raw data, data aggregations, filtered data, program code, documents, photographs, video, audio, etc. as may be generated by various automated systems, by user devices, and/or other devices.

As used in this description, the term "fragment" refers to one or more portions of content that may be stored at a storage node. For example, the data of a source object may be partitioned into a plurality of source fragments, wherein such source objects may comprise an arbitrary portion of source data, such as a block of data or any other unit of data including but not limited to individual files, collections of files, data volumes, data aggregations, etc. The plurality of source fragments may be erasure encoded to generate one or more corresponding repair fragments, whereby the repair fragment comprises redundant data with respect to the source fragments. The unit of data that is erasure encoded/decoded is a source block, wherein k is the number of source symbols per source block, Bsize is the source block size, Ssize is the symbol size (Bsize=k·Ssize), n is the number of encoded symbols generated and stored per source block, and r is the number of repair symbols (r=n−k), and wherein the symbol is the atomic unit of data for erasure encoding/decoding. Although the symbol size (Ssize) may be different for different source blocks, the symbol size generally remains the same for all symbols within a source block. Similarly, although the number of source symbols (k), the number of repair symbols (r), and the number of encoded symbols generated may be different for different source blocks, the values generally remain the same for all source blocks of a particular object. Osize is the size of the source object and Fsize is the size of the fragment (e.g., where k is both the number of source symbols per source block and the number of fragments per source object, Osize=k·Fsize).

As used in this description, the terms "component," "database," "module," "system," "logic" and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

As used herein, the terms "user equipment," "user device," "end user device," and "client device" include devices capable of requesting and receiving content from a web server or other type of server and transmitting information to a web server or other type of server. In some cases, the "user equipment," "user device," "end user device," or "client device" may be equipped with logic that allows it to read portions or all of fragments from the storage nodes to recover portions or all of source objects. Such devices can be a stationary devices or mobile devices. The terms "user equipment," "user device," "end user device," and "client device" can be used interchangeably.

As used herein, the term "user" refers to an individual receiving content on a user device or on a client device and transmitting information or receiving information from to a website or other storage infrastructure.

Embodiments according to the concepts of the present disclosure provide solutions with respect to storing and accessing source data in a reliable and efficient manner within a storage system of unreliable nodes (i.e., nodes that can store data but that can intermittently fail, in which case the data stored on them is temporarily unavailable, or permanently fail, in which case the data stored on them is permanently lost). In particular, embodiments herein provide methodologies, as may be implemented in various configurations of systems and methods, for reliably storing data and/or facilitating access to data within a storage system using fragment encoding techniques other than Maximum Distance Separable (MDS) codes, such as may utilize large erasure codes (e.g., RAPTOR Forward Error Correction (FEC) code as specified in IETF RFC 5053, and RAPTORQ Forward Error Correction (FEC) code as specified in IETF RFC 6330, of which software implementations are available from Qualcomm Incorporated). Although, large erasure codes have generally not been considered with respect to solutions for reliably and efficiently storing and accessing source data within a storage system of unreliable nodes due to potential demands on repair bandwidth and potential inefficient access when the desired data is not directly available, embodiments described in U.S. patent application Ser. Nos. 14/567,203, 14/567,249, and 14/567, 303, each entitled "SYSTEMS AND METHODS FOR RELIABLY STORING DATA USING LIQUID DISTRIBUTED STORAGE," each filed Dec. 11, 2014, the disclosures of which are hereby incorporated herein by reference, utilize a lazy repair policy (e.g., rather than a reactive, rapid repair policy as typically implemented by systems implementing a short erasure code technique) to control the bandwidth utilized for data repair processing within the storage system. The large erasure code storage control of embodiments operates to compress repair bandwidth (i.e., the bandwidth utilized within a storage system for data repair processing) to the point of operating in a liquid regime (i.e., a queue of items needing repair builds up and the items are repaired as a flow), thereby providing large erasure code storage control in accordance with concepts herein.

The method of embodiments includes obtaining, by the logic of the storage system, a prospective number of fragment losses (L) for verifying source data integrity with respect to the storage system. Embodiments of the method further include determining, by the logic of the storage system, a set of erasure coded fragments commonly available for one or more source objects stored by the storage system, and analyzing, by the logic of the storage system, a plurality of combinations of loss of the prospective number of fragments from the commonly available set of erasure coded fragments to verify data integrity in the storage system, whereby it is determined whether the storage system is susceptible to source data loss due to a loss of L erasure coded fragments. The embodiments, or parts thereof, are variously referred to herein as verification of code resiliency, verifying source data integrity, verification resiliency testing, verifying decodability, verify decodability, verification code test, data integrity forward checking, forward checking, forward checking of data integrity, data integrity checking, and other similar terminology.

In some embodiments, repair can be executed in such a way that if a first object has less available fragments than a second object, then the set of ESIs associated with the available fragments for the first object is a subset of the set of ESIs associated with the available fragments for the second object, i.e., all the available fragments for the first object are in common with the available fragments for the second object, and thus the ESIs of the available fragments for the first object are nested within the ESIs of the available fragments for the second object, in which case the available fragments for the first source object are referred to herein as commonly available for the first and second source objects. In this case, if an object with the least number of available fragments is decodable (recoverable) then all other objects are decodable (recoverable), and thus decodability of all the objects can be verified by verifying that decoding is possible from the (unique) set of ESIs associated with an object with the least number of available fragments, since all of the fragments available for an object with the least number of available fragments are common to the set of available fragments for any other object. More generally stated, a set of fragments is commonly available for a set of one or more source objects if each fragment in the set of fragments (e.g., as identified by its ESI) is available for each source object in the set of source objects. Thus verifying decodability with respect to a set of commonly available fragments (e.g., based on their ESIs) can be used to verify decodability of all source objects in the set of source objects. Thus, even if the ESIs for a set of source objects do not have the nesting property described above, a set of commonly available fragments for the set of source objects may still be determined and used to verify decodability of all source objects in the set of source objects. For example, a first source object may have available fragments identified by ESIs 0, 1, 2, 3, 4, 5, 6, whereas a second source object may have available fragments identified by ESIs 2, 3, 4, 5, 6, 7, 8, and thus even though this pair of source objects do not have the nesting property described above, the commonly available fragments for this pair of source objects can be identified by the ESIs 2, 3, 4, 5, 6, and if decodability is possible using only these commonly available fragments then decoding is possible for both source objects. Thus verifying decodability with respect to a set of commonly available fragments (e.g., based on their ESIs) can be used to verify decodability of all source objects in a set of source objects.

It should be appreciated that there are various metrics by which to evaluate a storage system solution. Such metrics include reliability, storage efficiency, repair bandwidth efficiency, and access efficiency.

Reliability provides a measure of the amount of time that all source data can be stored without loss of any of the data. Reliability is usually measured as a mean time to source data loss, and typically measured in years. The reliability metric used in accordance with some embodiments herein is the mean time to loss of any source data, or mean time to data loss (MTTDL). MTTDL is sometimes estimated, for example, by calculating a mean time to loss of a particular piece of source data and multiplying that metric by the number of pieces of source data in the storage system. However, the accuracy of this estimate method relies upon the assumption that each piece of source data is lost independently of other pieces, and this assumption may not be true for some systems.

Storage efficiency provides a measure of the fraction of the available storage within the storage system that can be used to store source data. Storage efficiency ($\alpha$) measures the ratio of the total size of source objects in the system to the total target amount of data used to store the source objects, and the storage overhead or storage redundancy ($\beta$) is $1-\alpha$. That is, storage overhead or storage redundancy is the ratio of the total target amount of repair data for all objects divided by the total target amount of source and repair data for all objects in the storage system when using a systematic erasure code to store the objects. Thus, the storage overhead is the target fraction of the used storage that is not for source data. The storage efficiency ($\alpha$), being the target fraction of storage usable for source data, may thus be represented in terms of the storage overhead as $\alpha=1-\beta$.

Repair bandwidth efficiency provides a measure of the amount of network bandwidth used for repairing lost data from failed storage nodes. It should be appreciated that repair bandwidth may be a shared resource with the access bandwidth and/or storage bandwidth (e.g., each taken from the available data communication bandwidth). Accordingly, an upper bound on the repair bandwidth (R) may be provided according to embodiments herein.

The ratio of an amount of data that is read from storage nodes to a resulting amount of repair data that is generated and stored on storage nodes is one measure of repair bandwidth efficiency. Accordingly, repair bandwidth efficiency may be measured by the ratio of the number of fragments that need to be read to decode the source data to the number of fragments that are generated for the repair. Thus, the larger the number of fragments generated for a particular source object by the repair process, the higher the repair bandwidth efficiency.

Access efficiency provides a measure of the amount of data that needs to be read from the storage system to retrieve a given portion of source data (e.g., $f(A)$ is the amount of read data from the storage nodes to access A bytes of source data, wherein when $f(A)$ is greater than A the data access is inefficient). It should be appreciated that the amount of time to access source data is related to the access efficiency. Accordingly, when the amount of data read from the storage nodes to access a particular portion of source data is larger than that portion of source data, not only is more bandwidth than minimally necessary used to access the data but the amount of time it takes to access the source data can be longer than minimally necessary. Accordingly, embodiments herein are adapted to provide implementations wherein very nearly $f(A)=A$.

Permanent failure of the nodes is often modeled by a Poisson process parameterized by λ, which denotes the failure rate of each node according to an exponential distribution. There are also intermittent failures of nodes (e.g., a node that is not available for some small interval of time but which comes back online and is fully available again). As previously mentioned, such intermittent node failures are far more typical than permanent node failures. Accordingly, a repair policy is not needed to recover the data temporarily unavailable on these nodes as eventually this data will become available again when the node comes back online and thus when nodes fail there is some period of time, as may be denoted by an intermittent failure threshold, T, until it is determined whether the failure is intermittent or permanent. Nodes can be added to the storage system to replace nodes that have failed permanently. When replacement nodes are available for permanently failed nodes, the repair policy can repair an object that has lost fragments on failed nodes by reading fragments for the object from other nodes, erasure decode the object from the read fragments, erasure encode additional fragments from the object, and store these additional fragments on replacement nodes.

The repair bandwidth metric, R, utilized according to some embodiments of the present disclosure is an amount of bandwidth provisioned to be used by the repair policy to ensure a provided MTTDL, whereby the repair policy may use this amount of repair bandwidth at each point in time, or more generally the repair policy may use this amount of repair bandwidth when averaged over a longer window of time. The repair bandwidth provisioned to the repair process may be respected on an instantaneous basis (i.e., the repair process may use repair bandwidth at a steady rate that is at or below the provisioned repair bandwidth). Alternatively, the repair bandwidth provisioned to the repair process may be considered as an average over a long window of time that is sufficient for the repair process to achieve a provisioned MTTDL, and thus the repair process may decide to use the repair bandwidth in, for example, a scheduled manner independent of the timing of storage node failures. For example, the repair process may be scheduled to run periodically for an hour or two each day, for a few hours each week, or for a few hours each month or couple of months, such that the average repair bandwidth used by the repair process over these windows of times averages to the provisioned repair bandwidth.

The repair policy may use such a provisioned repair bandwidth in a way that avoids interference with other processes sharing the same bandwidth resources, such as an access process that is accessing data stored on the storage nodes, or a storage process that is storing data to the storage nodes. For example, the repair policy may detect that another process needs to use a significant part of the shared bandwidth for some period of time, and the repair process may suspend or significantly slow down its usage of repair bandwidth during this period of time and then use more repair bandwidth again after the other processes bandwidth needs have reduced. In this example, the repair policy is essentially running as a background process with respect to bandwidth consumption (e.g., the repair policy backs off on its usage of bandwidth in response to other processes increased bandwidth usage). As another example, the repair policy may have scheduled times when it uses repair bandwidth, and refrain from using repair bandwidth at other times, wherein the scheduled times of repair bandwidth usage are for example times when other processes that share the bandwidth resources are typically quiescent (e.g., the repair process uses repair bandwidth from 1 A.M. to 3 A.M. each morning when there is very little access or storage activity within the storage system). In these cases, the usage of repair bandwidth by the repair server is largely independent of the timing of data loss within the storage system (e.g., the timing of permanent or intermittent storage node failures).

The access efficiency metric may be considered with respect to a plurality of situations. For example, the access efficiency metric may be considered with respect to the case where there are no node failures (intermittent or permanent) amongst the storage nodes that are used to store the source data, and the case where there are node failures (intermittent or permanent) amongst the storage nodes that are used to store the source data. The amount of data read from storage nodes in order to access a chunk of source data is an important component of access efficiency because this largely determines the speed at which a chunk can be accessed. Ideally, the amount of data read to access a chunk should be equal to the size of the chunk.

Previous solutions for storing and accessing source data within a storage system have primarily focused on using a reactive repair policy with respect to data determined to be unavailable. In operation according to such reactive repair policies, data is scheduled for repair as soon as any data is lost on a permanently failed node, and as much bandwidth as necessary is used to perform the repair in a burst. A Markov chain analysis is typically applied to individual objects in the storage system for the reliability analysis of a reactive repair policy. The analysis assumes that the number of objects that need repair is always nearly zero, which is justified if the repair policy can always work quickly enough.

With a reactive repair policy, the overall amount of repair traffic generated is proportional to at least k+1 times the amount of data lost on permanently failed nodes, where k is the number of source symbols used by the erasure code. This is because each time a fragment of an object is lost on a permanently failed node, at least k fragments for that object are read by the repair policy to generate at least one repair fragment that is stored on replacement nodes.

Large erasure code solutions in combination with a lazy repair policy achieve better trade-offs in storage efficiency, repair bandwidth efficiency, and reliability than is possible for any small erasure code solution. In particular, the use of a large erasure code according to embodiments provides a number of advantages, such as advantages associated with spreading the data for a particular object over many nodes and providing improved repair and access properties. Such large erasure codes that are not inherently MDS cannot, however, guarantee code performance. That is, although large erasure codes provide very high data recovery reliability of a source object from k fragments (e.g., in the range of 99%), recovery is nevertheless not guaranteed. The use of some additional number of fragments, x, increases recovery reliability (e.g., source object data recovery using k+x fragments, where x=1 provides data recovery in the range of 99.99% and where x=2 provides data recovery in the range of 99.9999%). However, no amount, x, of additional fragments may be sufficient to guarantee recovery of the source data. Nevertheless, embodiments utilizing large erasure codes provide smoothness and efficiency of repair bandwidth, wherein efficiency may arise from an overhead operating point implemented and diminishing efficiency returns may be realized from operating near k available fragments. Additionally, embodiments realize improved accessibility through operating with a minimum redundancy, Y, (e.g., a minimum number of available redundancy fragments) providing network and device multiplexing gains on latency, wherein accessibility is benefited from a larger number of available redundancy fragments. Moreover, the large erasure codes utilized according to embodiments provides good, albeit probabilistic, data recovery performance along with superior encoding and decoding performance (as compared to small erasure codes).

Figure 2A:
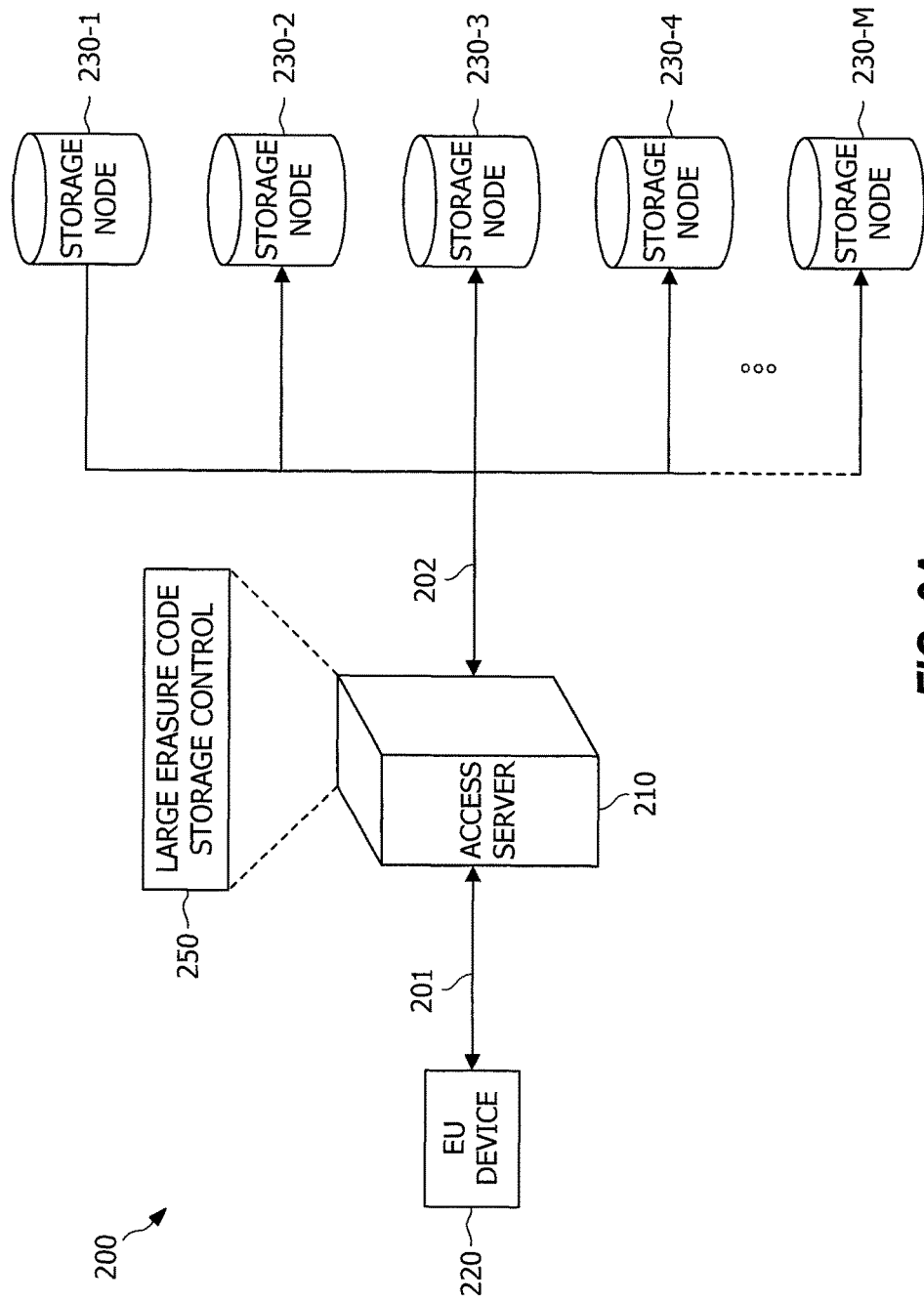
FIGS. 2A and 2B show detail with respect to exemplary implementations of storage systems adapted to provide verification of code resiliency according to embodiments of the present disclosure.
Figure 2B:
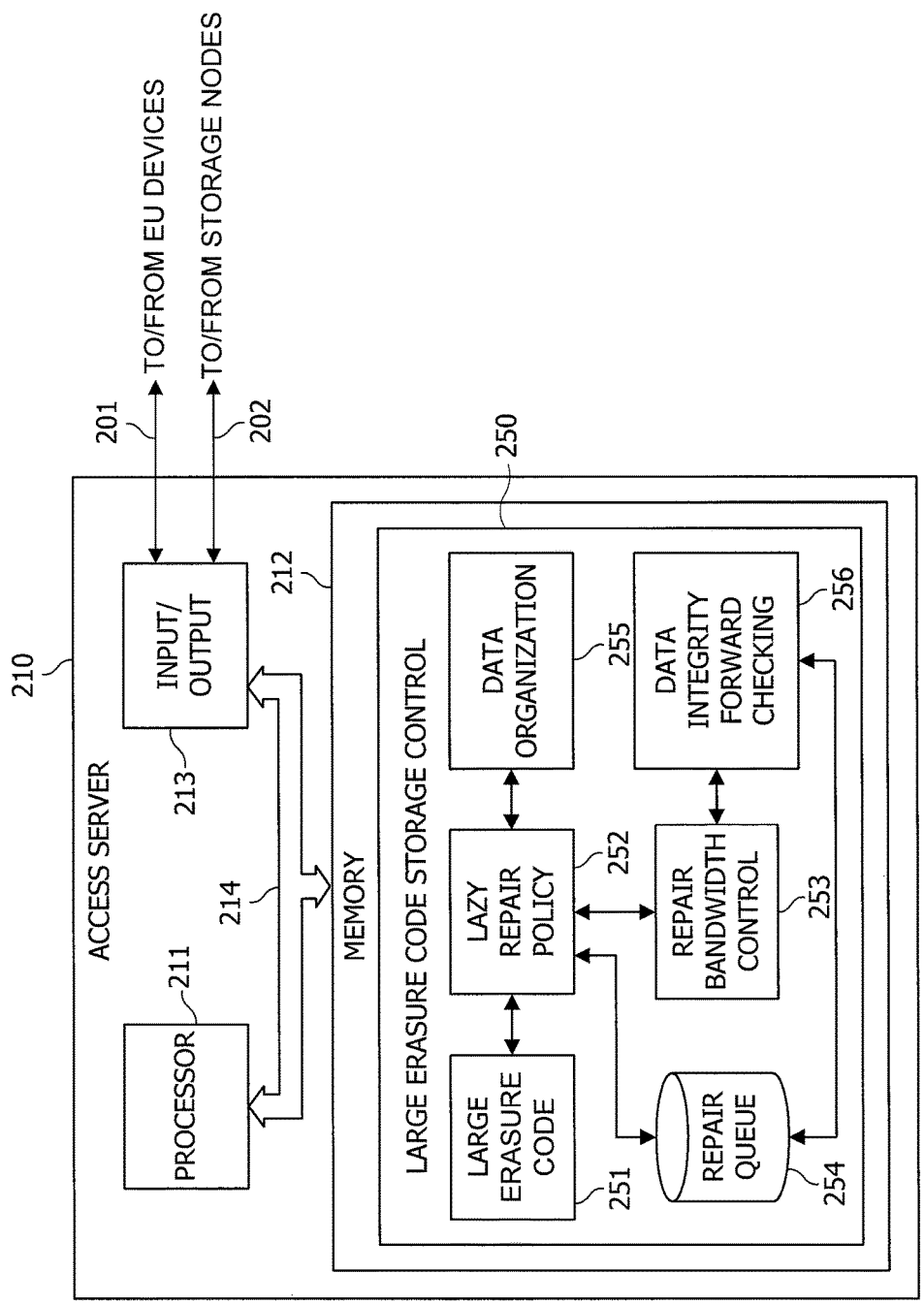

FIGS. 2A and 2B show storage system 200 adapted to provide large erasure code storage control according the concepts disclosed herein. Large erasure code storage control according to embodiments provides forward checking of data integrity, such as to assure that the objects most susceptible to failure (e.g., the objects having the fewest fragments remaining, objects having fragments stored on nodes having a higher failure rate, etc.) can still be recovered when a certain number of additional fragments are lost. For example, forward checking of data integrity may perform a real-time or near real-time check that a certain number of additional storage node failures (e.g., 5) can be tolerated without any objects becoming unrecoverable. That is, embodiments operate to prospectively analyze fragment losses with respect to one or more source objects, such as to determine the susceptibility of the storage system to source data loss.

Large erasure control according to embodiments additionally or alternatively provides operation to maintain a minimum redundancy with respect to the fragments stored by the system. For example, the repair bandwidth, R, may be provisioned or otherwise controlled to maintain a minimum redundancy, Y, in the system (e.g., maintain Y=0.1·k, Y=0.2·k, etc.). Accordingly, the repair bandwidth, R, may be shaped to maintain a minimum redundancy, Y, such as by dynamically controlling repair bandwidth (e.g., on-the-fly, in real-time, in near real-time, etc.). In operation, repair bandwidth may be increased if redundancy drops to or below the minimum redundancy metric, Y, according to embodiments. Correspondingly, the repair bandwidth may be decreased, such as when the node failure rate decreases, according to embodiments. Additionally or alternatively, large erasure control according to embodiments provides operation to provide improved access properties. For example, requests for data may be made for a number of fragments (e.g., k+Y fragments) more than that needed to decode the data, whereby the data may be decoded as soon as a sufficient number of fragments (e.g., k or k+x, where x<Y) are received, thereby avoiding node and network latency issues according to embodiments. Moreover, access speeds may be increased through a small increase in redundancy (e.g., redundancy>Y), according to embodiments. Additionally or alternatively, a data organization scheme may be employed to support efficient data accesses, such as data access to small portions of stored data, according to embodiments.

In facilitating the foregoing, the exemplary embodiment of FIG. 2A comprises access server 210, having large erasure code storage control logic 250 according to the concepts herein, in communication with EU device 220 to provide storage services with respect thereto. Source data for which storage services are provided by storage systems of embodiments herein may comprise various configurations of data including blocks of data (e.g., source blocks of any size) and/or streams of data (e.g., source streams of any size). The source objects corresponding to such source data as stored by storage systems of embodiments, may comprise individual files, collections of files, data volumes, data aggregations, etc., as well as portions thereof, as may be provided for storage processing (e.g., encoding, writing, reading, decoding, etc.) as blocks of data, streams of data, and combinations thereof. Thus, source objects herein may comprise application layer objects (e.g., with metadata), a plurality of application layer objects, some portion of an application layer object, etc. Such source objects may thus be quite small (e.g., on the order of hundreds or thousands of bytes), quite large (e.g., on the order of megabytes, gigabytes, terabytes, etc.), or any portion of data that may be separated into fragments or portions of fragments as described herein.

Access server 210 may comprise one or more servers operable under control of an instruction set to receive data from devices such as EU device 220, and to control storage of the data and to retrieve data in response to requests from devices such as EU device 220, wherein the HTTP 1.1 protocol using the GET and PUT and POST command and byte range requests is an example of how an EU device can communicate with an access server 210. Accordingly, access server 210 is further in communication with a plurality, M, of storage nodes (shown here as storage nodes 230-1 through 230-M), wherein the HTTP 1.1 protocol using the GET and PUT and POST command and byte range requests is an example of how an access server 210 can communicate with storage nodes 230-1 through 230-M. The number of storage nodes, M, is typically very large, such as on the order of hundreds, thousands, and even tens of thousands in some embodiments. Storage nodes 230-1 through 230-M may comprise a homogeneous or heterogeneous collection or array (e.g., RAID array) of storage media (e.g., hard disk drives, optical disk drives, solid state drives, RAM, flash memory, high end commercial servers, low cost commodity servers, personal computers, tablets, Internet appliances, web servers, SAN servers, NAS servers, IAN storage servers, etc.) providing persistent memory in which the electronic data is stored by and accessible through access server 210. EU device 220 may comprise any configuration of device (e.g., personal computer, tablet device, smart phone, personal digital assistant (PDA), camera, Internet appliance, etc.) which operates to generate, manage, and/or access electronic data. It should be appreciated that although only a single such device is shown, storage system 200 may operate to serve a plurality of devices, some or all of which may comprise devices in addition to or in the alternative to devices characterized as "end user" devices. Any or all of the foregoing various components of storage system 200 may comprise traditional (e.g., physical) and/or virtualized instances of such components, such as may include virtualized servers, virtualized networking, virtualized storage nodes, virtualized storage devices, virtualized devices, etc.

FIG. 2B shows additional detail with respect to access server 210 of embodiments. Access server 210 of the illustrated embodiment comprises a plurality of functional blocks, shown here as including processor 211, memory 212, and input/output (I/O) element 213. Although not shown in the representation in FIG. 2B for simplicity, access server 210 may comprise additional functional blocks, such as a user interface, a radio frequency (RF) module, a display, etc., some or all of which may be utilized by operation in accordance with the concepts herein. The foregoing functional blocks may be operatively connected over one or more buses, such as bus 214. Bus 214 may comprises the logical and physical connections to allow the connected elements, modules, and components to communicate and interoperate.

Processor 211 of embodiments can be any general purpose or special purpose processor capable of executing instructions to control the operation and functionality of access server 210 as described herein. Although shown as a single element, processor 211 may comprise multiple processors, or a distributed processing architecture.

I/O element 213 can include and/or be coupled to various input/output components. For example, I/O element 213 may include and/or be coupled to a display, a speaker, a microphone, a keypad, a pointing device, a touch-sensitive screen, user interface control elements, and any other devices or systems that allow a user to provide input commands and receive outputs from access server 210. Additionally or alternatively, I/O element 213 may include and/or be coupled to a disk controller, a network interface card (NIC), a radio frequency (RF) transceiver, and any other devices or systems that facilitate input and/or output functionality of client device 210. I/O element 213 of the illustrated embodiment provides interfaces (e.g., using one or more of the aforementioned disk controller, NIC, and/or RF transceiver) for connections 201 and 202 providing data communication with respect to EU device 220 and storage nodes 230-1 through 230-M, respectively. It should be appreciated that connections 201 and 202 may comprise various forms of connections suitable for data communication herein, such as provided by wireline links, wireless links, local area network (LAN) links, wide area network (WAN) links, SAN links, Internet links, cellular communication system links, cable transmission system links, fiber optic links, etc., including combinations thereof.

Memory 212 can be any type of volatile or non-volatile memory, and in an embodiment, can include flash memory. Memory 212 can be permanently installed in access server 210, or can be a removable memory element, such as a removable memory card. Although shown as a single element, memory 212 may comprise multiple discrete memories and/or memory types. Memory 212 of embodiments may store or otherwise include various computer readable code segments, such as may form applications, operating systems, files, electronic documents, content, etc.

Access server 210 is operable to provide reliable storage of data within storage system 200 using large erasure code storage control, such as may be configured to provide liquid distributed storage control. Accordingly, memory 212 of the illustrated embodiments comprises computer readable code segments defining large erasure code storage control logic 250, which when executed by a processor (e.g., processor 211) provide logic circuits operable as described herein. In particular, large erasure code storage control logic 250 of access server 210 is shown in FIG. 2B as including a plurality of functional blocks as may be utilized alone or in combination to provide various aspects of storage control (e.g., liquid distributed storage control operation) for reliably storing data within storage system 200. Further detail regarding the implementation and operation of liquid distributed storage control by a storage system is provided in U.S. patent application Ser. Nos. 14/567,203, 14/567,249, and 14/567,303 each entitled "SYSTEMS AND METHODS FOR RELIABLY STORING DATA USING LIQUID DIS-TRIBUTED STORAGE," and each filed Dec. 11, 2014, the disclosures of which are hereby incorporated herein by reference.

Large erasure code storage control logic 250 of the illustrated embodiment includes large erasure code logic 251, lazy repair policy logic 252, repair bandwidth control logic 253, and data organization logic 255. It should be appreciated that embodiments may include a subset of the functional blocks shown and/or functional blocks in addition to those shown.

The code segments stored by memory 212 may provide applications in addition to the aforementioned large erasure code storage control logic 250. For example, memory 212 may store applications such as a storage server, useful in arbitrating management, storage, and retrieval of electronic data between EU device 210 and storage nodes 230-1 through 230-M according to embodiments herein. Such a storage server can be a web server, a NAS storage server, a SAN storage server, an IAN storage server, and/or the like.

In addition to the aforementioned code segments forming applications, operating systems, files, electronic documents, content, etc., memory 212 may include or otherwise provide various registers, buffers, caches, queues, and storage cells used by functional blocks of access server 210. For example, memory 212 may comprise one or more system maps that are maintained to keep track of which fragments are stored on which nodes for each source object. Additionally or alternatively, memory 212 may comprise various registers storing operational parameters, such as erasure code parameters, utilized according to embodiments. Likewise, memory 212 may comprise one or more repair queues, such as repair queue 254, providing a hierarchy of source object instances for repair processing.

In operation according to embodiments, the source blocks of electronic data are stored in storage system 200 as objects. The source objects utilized herein may, for example, be approximately equal-sized. Source blocks, and thus the corresponding objects stored by the storage system, may comprise individual files, collections of files, data volumes, data aggregations, etc. and may be quite large (e.g., on the order of megabytes, gigabytes, terabytes, etc.). Access server 210 may operate to partition arriving source data into source objects and to maintain mapping of the source data to the source objects (e.g., Map:App-Obj comprising an application or source object map providing mapping of source data to objects). Access server 210 may further operate to erasure encode the source objects, divide the source objects into fragments, store each fragment of a source object at a different storage node, and maintain a source object to fragment map (e.g., Map:Obj-Frag comprising an object fragment map providing mapping of objects to fragments). Accordingly, the objects are partitioned by logic of access server 210 into fragments for storage in the storage system. For example, an object may be partitioned into k fragments for storage in storage system 200. Each of the k fragments may be of equal size according to embodiments. In operation according to embodiments herein the aforementioned fragments may comprise a plurality of symbols.

In implementing such partitioned storage of source data according to embodiments there can be a unique encoded symbol ID (ESI) associated with each of the M storage nodes, and all fragments stored on the storage node are generated using the ESI associated with that node. Thus a mapping may be maintained for each storage node indicating the associated ESI and a mapping may be maintained for each source object indicating which fragments are stored on which storage nodes (e.g., a Map:Obj-Frag map indicating the encoded symbol ID (ESI) and the storage node ID for each fragment of each source object). Alternatively, mapping of ESIs to storage nodes may be maintained individually for each object, or for a group of objects and thus a storage node may have a fragment associated with a first ESI for a first object and a fragment associated with a second ESI for a second object. In some embodiments, multiple ESIs may be mapped to the same storage node for an object.

The particular storage nodes upon which the n fragments for any source object are stored may be selected by assigning the source object to a data storage pattern (also referred to as a placement group), wherein each data storage pattern is a set of n preselected storage nodes (e.g., as may be identified by a storage node identifier). That is, a data storage pattern is a set of n storage nodes on which the fragments of a source object are placed. In a typical storage system where n is much smaller than M, the number of patterns t may be approximately a constant multiple of the number of storage nodes M. The number of data storage patterns can vary over time, such as due to storage node failures rendering data storage patterns incident thereon obsolete. In alternative embodiments, a data storage pattern is a set of n preselected disks, wherein a disk may be a HDD disk or an SSD or any other type of storage device and wherein a storage node may host multiple disks. That is, a data storage pattern is a set of n disks on which fragments of a source object are placed.

Embodiments herein may for different sets of objects operate to assign ESIs in a different order (e.g., permutation of the ESIs) to the same set of storage nodes of a large/liquid storage system. Furthermore, different sets of ESIs may be assigned to the same set of storage nodes for different sets of objects. In implementing such an ESI pattern for a set of objects (i.e., an ESI pattern is a mapping of a set of ESIs to a set of storage nodes for a given set of objects) technique according to embodiments, a set of ESI patterns is specified to the same set of storage nodes (e.g., the available storage nodes), wherein the ESIs assigned to the same storage node is different across the different ESI patterns. As an example, 100 ESI patterns may be specified that map a given set of 3000 ESIs to the same set of 3000 storage nodes (e.g., where k=2000 and n=3000), wherein the mapping of the ESIs to the storage nodes for each ESI pattern may be specified by choosing independently a random permutation of the ESIs and mapping the permutation to the storage nodes in a fixed order. As source objects are stored in the storage system, they may be assigned to one of the 100 ESI patterns (e.g., in round-robin fashion), whereby the ESI pattern assignments determine which fragments (identified by their ESI) are stored at which storage node for the source object. It should be appreciated that implementation of such ESI pattern embodiments greatly ameliorates the concern that the underlying erasure code, such as RAPTORQ, is not a MDS code, and greatly reduces the risk of having to perform emergency repair at a very high overall peak repair rate. In alternative embodiments, an ESI pattern is a mapping of a set of ESIs to a set of disks. Any such techniques for specifying ESI patterns are combined with techniques for verification of code resiliency according to embodiments herein to provide highly resilient storage of source data with data viability monitoring.

Irrespective of the particular ESI assignment scheme utilized, the aforementioned mapping information may be updated for source objects indicating which fragments are available when a storage node permanently fails. Access server 210 may operate to determine which source object particular source data (e.g., source data requested by EU device 220) is contained within (e.g., using a Map:App-Obj map) and to read the data from the storage nodes storing the appropriate fragments by determining which of the fragments contain relevant source or repair data (e.g., using a Map:Obj-Frag map).

In providing resilient and reliable storage of the data, access server 210 of embodiments utilizes one or more erasure codes with respect to the source objects, wherein repair fragments are generated to provide redundant data useful in recovering data of the source object. For example, embodiments of large erasure code storage control logic implement erasure codes parameterized as (n; k; r), where k is the number of source symbols in a source block, n is the total number of encoded symbols, and r=n−k is the number of repair symbols.

An (n; k; r) erasure code solution, wherein (n; k; r) are small constants, is said to be a small erasure code solution if n<<M or if n is small independently of M (e.g. n<30, or n<20). In utilizing such a small erasure code, a source object is typically partitioned into k source fragments that are erasure encoded to generate n encoded fragments, wherein r of the n fragments are repair fragments. Of the M storage nodes in the storage system, n storage nodes may then be chosen (e.g., storage nodes chosen randomly, storage nodes having independent failures chosen, etc.) and the n fragments stored to the n chose storage nodes, one fragment per storage node. Maximum Distance Separable (MDS) erasure codes are an example of such small erasure codes. The repair strategy traditionally implemented with respect to such small erasure codes is a reactive, rapid repair policy.

An (n; k; r) erasure code solution is a large erasure code solution if n=M (i.e., for each source object there are fragments stored at all the storage nodes), if n is a significant fraction of M (e.g., n≥½·M), or if n is large although perhaps chosen independently of M (e.g., n≥50, or n≥30). An exemplary large erasure code such as may be utilized according to embodiments herein include RAPTORQ as specified in IETF RFC 6330, available from Qualcomm Incorporated. Further examples of large erasure codes as may be utilized herein include RAPTOR as specified in IETF RFC 5053, LDPC codes specified in IETF RFC 5170, tornado codes, and Luby transform (LT) codes.

A property of maximum distance separable (MDS) erasure codes is that all k source symbols can be recovered from any k of the n encoded symbols. Particular erasure codes that are not inherently MDS, such as the exemplary large erasure codes herein (e.g., RAPTORQ), provide a high (e.g., 99%) probability that the k source symbols can be recovered from any k of the n encoded symbols and a higher (e.g., 99.99%, 99.9999%, etc.) probability that the k source symbols can be recovered from any k+x (e.g., x=1, 2, etc.) of the n encoded symbols.

In operation, each fragment (i.e., the source fragments and repair fragments) of a source object is stored at a different storage node than the other fragments of the source object (although multiple fragments are stored at the same storage node in some embodiments). The storage overhead is the ratio of the total target amount of repair data for all objects divided by the total target amount of source and repair data for all objects in the storage system when using a systematic erasure code for storage. Thus, the storage overhead is the target fraction of the used storage that is not for source data.

In some cases, source data is not directly stored in the storage system, only repair data. In this case, there are n repair fragments stored in the storage system for each object, where generally any k (for some erasure codes slightly more than k is sometimes utilized) of the n fragments can be used to recover the original object, and thus there is still a redundant storage of r=n−k repair fragments in the storage system beyond the k needed to recover the object. An alternative type of storage overhead is the ratio of the total target amount of redundant data (r=n−k) divided by the total amount of source data (k), i.e., the storage overhead is r/k for this type. Generally herein r/n is used as the storage overhead, and one skilled in the art can see that there is a conversion from one type of storage overhead to the other type of storage overhead.

In operation according to a reactive, rapid repair policy, the repair of missing fragments is implemented at a high bandwidth when a storage node fails. That is, the repair policy causes repair server functionality of an access server to attempt to repair fragments lost on a storage node as soon as possible in order to repair a failed storage node before another storage node fails and in order to avoid source objects having more than one missing fragment (as is generally necessary in order to meet reliability targets in light of the small number of repair fragments, or redundant data, available using a small erasure code). Such reactive, rapid repair policies use a large amount of burst repair traffic at times that are dictated by when nodes fail and not at scheduled times. Thus, the burst repair traffic might occur at times when other processes that share the bandwidth are active, such as access processes retrieving data from the storage system or storage processes storing data to the storage system. Thus, if one of these other processes happens to be actively using bandwidth in a period of time that overlaps with the burst repair traffic triggered by a storage node failure, the performance of these other processes can be negatively impacted (e.g., degraded, by the burst repair traffic).

Although small erasure codes, such as those described above (e.g., n<<M), may be utilized in some embodiments, the illustrated embodiment of access server 210 implements (e.g., using large erasure code logic 251) a large erasure code (e.g., n≥½·M) solution to provide storing and accessing source data in a reliable and efficient manner within a storage system of unreliable nodes. In utilizing such a large erasure code according to embodiments, a source object may be partitioned into k source fragments that are erasure encoded to generate n encoded fragments, wherein in some embodiments r of the n fragments are repair fragments. The n fragments may then be stored to the M storage nodes, one fragment per storage node.

Large erasure code storage control logic 250 of embodiments implements a repair policy in order to provide recovery of lost fragments and thereby facilitate resilient and reliable storage of the source data. For example, a repair policy of large erasure code storage control logic 250 may run in the background (e.g., as a background task to a storage server application) to monitor storage nodes to determine which storage nodes have failed and provide operation to replace fragments stored on the failed storage node. In operation according to embodiments, an object to fragment mapping (e.g., the aforementioned Map:Obj-Frag map) may be utilized to keep track of where fragments are located such that when a storage node is determined to have permanently failed the loss of the fragments stored thereby are identified (e.g., the fragments which are no longer available due to failure of the storage node are determined). These fragments, or some portion thereof, may be tracked in a repair queue for repair operations in accordance with the repair policy.

Although it may be beneficial to use a reactive, rapid repair policy (i.e., when a fragment of an object is lost due to a permanent node failure, the repair policy replaces the lost fragment with another fragment as quickly as possible) for a small erasure code solution, embodiments utilize a lazy repair policy (i.e., objects are allowed to accumulate whereby they may be repaired at a steady repair rate, R), such as through operation of lazy repair policy logic 252. It should be appreciated, however, that embodiments may implement a repair policy other than a lazy repair policy, such as a reactive repair policy.

In implementing a lazy repair policy according to embodiments, the repair rate, R, is designed to ensure a large mean time to loss of any source data (MTTDL). The repair rate may be expressed as the number of bits of source objects repaired per second (i.e., the rate in bits per second that source objects are processed from a state of missing fragments to a state of having all fragments available). This form of expressing the repair rate is convenient since generally it also corresponds to the rate at which data is read from storage nodes by the repair process. However, there are many other forms of expressing the repair rate. For example, the repair rate may be expressed as the amount of time it takes to repair each source object (e.g., in the case when all source objects are the same size), or the amount of time per byte of source object repair. As one skilled in the art will recognize, any of these forms of expressing the repair rate can be easily converted to another form. Additionally or alternatively, repair bandwidth usage may be scheduled to occur at times that are largely independent of the specific timing of node failures. For example, repair bandwidth may be scheduled to be used for a couple of hours each night when other bandwidth activity, such as access or storage of data, is quiescent. Thus, the repair process may use most or all of the available bandwidth for a short period of time on a regular basis, to avoid interrupting or disrupting other bandwidth intensive activities such as access or storage of data. As another example, the repair process may be scheduled to occur only occasionally when the storage system is powered up, and at other times the storage system is powered down to save on energy consumption and costs. The scheduling of the repair process to use repair bandwidth may also be on an irregular basis (i.e., scheduled when other processes such as reading or writing data to storage are relatively inactive). In every case, the repair bandwidth usage can be crafted to avoid interrupting other processes that send or receive data over some or parts of the same networking paths as used by the repair process, and the repair bandwidth usage can be so crafted independently of the timing of data loss events such as storage node failures. The amount of repair done during these periods may be determined by a repair policy that dictates the desired average rate of repair over longer time periods. Thus, on a longer time scale the repair process is fluid and may be modulated to respond to changing conditions such as node failure rates while on a short time scale the repair may be scheduled for system convenience such as described in the preceding examples.

In operation, logic of the repair policy may, based on the aforementioned system maps, determine which fragments are available and which are missing for each source object. Repair processing is performed according to embodiments with respect to those fragments that are determined to be permanently lost, such as due to permanent failure of the storage node upon which the fragment is stored. Permanent failure of the storage nodes is often modeled by a Poisson process parameterized by $\lambda$, which denotes the failure rate of each node according to an exponential distribution. A time varying rate parameter $\lambda$ may be a more suitable model to capture changes in conditions, quality of components, etc.

The repair policy of embodiments maintains a repair queue of object instances (e.g., repair queue 254), wherein a source object instance is added to the repair queue for a source object when it is possible to generate and store additional fragments for that source object (e.g., when storage nodes that store fragments for that source object have failed, when new or replacement storage nodes have been added to the storage system, etc.). Embodiments implementing a large erasure code solution using a lazy repair policy may operate to add a source object instance to the repair queue when a pre-specified minimum number (e.g., minQ>1, minQ=1, etc.) of fragments for that source object are lost due to node storage failures, such as to limit the overall amount of repair traffic. Equivalently, all objects may be in the queue but repair is suspended when no object has more than minQ erased fragments.

Whenever there is at least one source object instance in the repair queue that has a sufficient number of missing fragments the repair policy of embodiments works to repair the source objects corresponding to source object instances in the repair queue. For example, logic implementing the repair policy may linearly cycle through the object instances in the repair queue, read in at least k fragments to recover a source object in need of repair, and generate and store additional fragments for the source object on one or more replacement storage nodes.

Referring again to FIGS. 2A and 2B, storage system 200 is adapted according to the concepts herein to verify data integrity in a storage system storing source objects as a plurality of erasure coded fragments. In particular, embodiments provide large erasure code storage control implementing forward checking of data integrity to thereby provide information regarding the continued viability of source data stored by the storage system. Accordingly, storage system 200 of the illustrated embodiment, in addition to including large erasure code logic 251, lazy repair policy logic 252, repair bandwidth control logic 253, and data organization logic 255, is shown as comprising data integrity forward checking logic 256. In operation according to embodiments, forward checking of data integrity may be performed in real-time or near real-time to check that a number of node failures can be tolerated without loss of data, such as to assure that a certain minimum number of fragments will be available for the objects most susceptible to failure.

It should be appreciated that, although embodiments are described herein with reference to the use of large erasure codes, the data integrity forward checking provided according to the concepts herein is applicable with respect to any number of erasure code configurations. For example, embodiments of data integrity forward checking are particularly useful with respect to any code that is not MDS (maximum distance separable) or not known to be MDS, wherein the recovery properties with respect to the available fragments are not known a priori.

In operation of storage system 200, various source objects to be stored by the storage system may be received from one or more EU devices, broken into a number of source symbols or fragments (k) and erasure encoded (e.g., using a large erasure code) to generate a number of repair fragments (r) and thereby provide a total number of encoded fragments (n, where n=k+r), wherein each of the encoded fragments is stored on a different storage node (M) of the storage system (e.g., n≤M). Throughout operation of storage system 200, a number of the storage nodes may permanently fail (and thus the fragments stored thereon are lost), whereby the repair policy implemented by lazy repair policy 252 provides for the queuing of source objects needing repair (e.g., decoding of fragments and regeneration of source and/or repair fragments), allowing the number of lost fragments to build up (e.g., to provide repair operations as a flow utilizing a provisioned repair bandwidth, R). Source objects at the head of the repair queue (e.g., repair queue 254) of embodiments will have the largest number of lost/missing fragments, and thus represent the source objects most at risk of data loss. For example, the total number of encoded fragments, n (n=k+r), is larger than the number of fragments needed to recover the source object. However, where the erasure code utilized is not an MDS erasure code, the number of fragments needed to recover the source object may not be known a priori (e.g., the number of fragments for recovery may be k or k+x, depending upon the particular combination of source objects (k) and repair objects (r) available for decoding the source data).

Embodiments of storage system 200 provide for the source objects having some number of fragments available in excess to the number of source fragments (k). For example, storage system 200 may operate with a redundancy margin (e.g., Y), whereby the storage system maintains a state where the number of fragments available for any source object (e.g., k+Y) exceeds the number of source fragments encoded (k) by some amount (e.g., 10-15%), to facilitate feasible data recovery and verification. Lazy repair policy logic 252 of embodiments may, for example, operate to maintain a minimum redundancy, Y, such as through use of the aforementioned repair bandwidth, R, (e.g., provided by repair bandwidth control logic 253).

It should be appreciated that the available fragments (e.g., the aforementioned k+Y number of available fragments) may not be the original fragments that were available for the respective source object, but instead, as storage nodes fail and the fragments thereon have not been repaired as of yet, may include any combination of source and repair fragments. Furthermore, due to storage node failures and object repair and other events, although the cardinality of the set of available fragments (as identified by associated ESIs) for objects may generally be at least k+Y, the fragments in the set of available fragments for objects may dynamically vary over time. Due to the non-MDS properties of the erasure code of embodiments and the variation in the set of available fragments, the particular number of fragments needed to recover a source object may vary based on the specific situation (e.g., certain combination of remaining source and/or repair fragments). Data integrity checking functionality provided according to embodiments herein, however, operates to provide forward checking of the fragments available within the storage system to ensure that sufficient redundancy of the data is maintained, such as to meet a desired Mean Time To Data Loss (MTTDL). For example, embodiments operate to analyze combinations of the available fragments (e.g., the available fragments for source objects most at risk of data loss, such as the source object(s) at the head of repair queue 254) to determine if additional storage node losses (and thus the loss of fragments thereon) can be tolerated (e.g., source data recovery is still possible).

Embodiments of a storage system implementing forward checking of data integrity herein may implement additional robust functionality, such as one or more data storage, data management, data redundancy, and/or data resiliency verification techniques. Examples of such robust storage system functionality as may be implemented in combination with forward checking of data integrity are described in U.S. patent application Ser. No. 14/954,877 entitled "CO-DERIVED DATA STORAGE PATTERNS FOR DISTRIBUTED STORAGE SYSTEMS," Ser. No. 14/954,855 entitled "SYSTEMS AND METHODS FOR PRE-GENERATION AND PRE-STORAGE OF REPAIR FRAGMENTS IN STORAGE SYSTEMS," Ser. No. 14/954,792 entitled "SYSTEMS AND METHODS FOR DATA ORGANIZATION IN STORAGE SYSTEMS USING LARGE ERASURE CODES," Ser. No. 14/954,814 entitled "SYSTEMS AND METHODS FOR DATA ORGANIZATION IN STORAGE SYSTEMS USING LARGE ERASURE CODES," Ser. No. 14/954,702 entitled "SYSTEMS AND METHODS FOR REPAIR RATE CONTROL FOR LARGE ERASURE CODED DATA STORAGE," Ser. No. 14/954,728 entitled "SYSTEMS AND METHODS FOR REPAIR RATE CONTROL FOR LARGE ERASURE CODED DATA STORAGE," and Ser. No. 14/954,644 entitled "SYSTEMS AND METHODS FOR VERIFICATION OF CODE RESILIENCY FOR DATA STORAGE," each filed concurrently herewith, the disclosures of which are hereby incorporated herein by reference.

Logic of data integrity forward checking logic 256 of embodiments operates to analyze combinations of the remaining fragments for one or more source objects (e.g., source objects at the head of the repair queue) stored by the storage nodes for each of the data storage patterns utilized by the storage system. Accordingly, where a plurality of data storage patterns are utilized, such as by an embodiment implementing the aforementioned ESI patterns and as described in the above patent application entitled "CO-DERIVED DATA STORAGE PATTERNS FOR DISTRIBUTED STORAGE SYSTEMS," each ESI pattern can be verified for code resiliency in operation according to embodiments of a verification of code resiliency technique. It should be appreciated that the foregoing implementation of techniques for specifying data storage patterns combined with techniques for verification of code resiliency increases the verification of code resiliency computation (e.g., by a factor of 100 in the above example where 100 ESI patterns are specified that map a given set of 3000 ESIs, since there are 100 ESI patterns to consider instead of 1). However, during normal operation, when the verification of code resiliency functionality is passing for all ESI patterns, typically the amount of repair for each of the ESI patterns is close to equal (i.e., each repair process is using approximately 1% of the repair bandwidth being used at a steady rate), since generally an equal amount of source object data is assigned to each ESI pattern. It should be appreciated that it is unlikely that the verification of code resiliency will fail for more than one ESI pattern at a time when an erasure code that is not inherently MDS such as RAPTORQ is used, since generally decoding is possible with high probability as long as fragments associated with k or slightly more than k ESIs are available and thus it is unlikely that more than one ESI pattern at a time will fail the verification of code resiliency test if there are not a large number of ESI patterns. Thus if one ESI pattern does fail and needs emergency repair processing, the emergency repair process for that ESI pattern can be sped up by a significant factor (e.g., by a factor of 100), possibly while the repair processes for the remaining ESI patterns is slowed down (e.g., to zero) during the emergency repair. As an alternative, the repair processes for the remaining ESI patterns may continue at their usual rate while the emergency repair is sped up, for example by a factor of 100, and thus during the time the emergency repair is occurring the global repair bandwidth usage is increased by a factor of at most two. Thus, the global peak repair bandwidth used by the repair processes for all of the ESI patterns can be maintained at a smooth and steady level even in the rare event that emergency repair is triggered due to failure of the verification of code resiliency for one or more ESI patterns. This alleviates the need for the underlying erasure code, such as RAPTORQ, to provide extremely high reliable decoding (MDS-like).

As an example of the above described use of ESI patterns with a verification of code resiliency technique according to embodiments, suppose the erasure code has failure probability of at most $10^{-9}$ for decoding from a random set of 2200 ESIs (i.e., each object of a set of objects associated with a given ESI pattern has fragments stored on each of 2200 available storage nodes). The verification of code resiliency for a particular ESI pattern may fail with probability $10^{-4}$ (e.g., check decoding with $10^5$ different sets of ESIs to verify resiliency against 5 future storage node failures). Thus, on average an ESI pattern may fail the verification of code resiliency test with probability at most $10^{-4}$. The chance that more than 5 out of the 100 ESI patterns fail at the same time is thus at most (100 choose 5)*$10^{(-4*5)} \leq 10^{-12}$. If there are 5 failing ESI patterns at the same time, then the repair process for each of these 5 ESI patterns can use up to 20 times the normal repair bandwidth for emergency repair, while the repair processes for the remaining 95 ESI patterns remain temporarily quiescent until the emergency subsides, and the global peak repair bandwidth will remain the same when emergency repair is occurring as when there is no emergency repair. Alternatively, if there are 5 failing patterns at the same time, then the repair process for each of these 5 ESI patterns can use up to 20 times the normal repair bandwidth for emergency repair, while the repair processes for the remaining 95 ESI patterns proceeds with normal repair, and the global peak repair bandwidth when emergency repair is occurring will be at most twice as when there is no emergency repair.

It should be appreciated there are many variants with respect to the use of data storage patterns, including the aforementioned ESI patterns, that may be implemented according to embodiments herein. For example, instead of choosing each of the ESI patterns independently at random, they may be chosen in a coordinated way. In accordance with embodiments, ESI patterns may be specified in a coordinated way so that there is anti-correlation, or at least not correlation, in the probability of failing the verification of code resiliency test for the ESI patterns when a storage node fails. For example, for RAPTORQ, each ESI I corresponds to a symbol that is formed as the XOR of a certain number w(I) of symbols from the intermediate block (wherein the intermediate block is generated from the source block), where w(I) depends on I and varies between 2 and approximately 30 for different values of I, and w(I) is called the weight of I. Thus, one coordinated way of determining a set of ESI patterns is to ensure that the sum of w(I) over all ESI I assigned to a storage node (summed over all ESI patterns) is approximately the same for each storage node. This can be beneficial, as it may be the case that symbols associated with ESIs may be more likely to help to decode than other ESIs based on the weight of the ESI (i.e., ESIs with higher weight can be more likely to help to decode). Thus, when a storage node is lost, the sum over the ESI patterns of the weights of the ESIs of symbols stored on that storage node is equal, and if one ESI pattern fails the verification of code resiliency test it makes it less likely that other ESI patterns fail the test.

As another example of choosing ESI patterns in a coordinated way, the ESI patterns may be chosen randomly or pseudo-randomly, and then extensive testing could verify that there is no correlation in the probability of failing the verification code test for the ESI patterns. If correlation is found, then ESI patterns can be discarded and new ESI patterns added for further testing, until a suitable set of ESI patterns is determined. As an alternative, or in addition, the ESIs utilized within an ESI pattern may be discarded if they are found to cause (or be correlated with) failures of the verification code test for that ESI pattern, and discarded ESIs may be replaced with different ESIs to be utilized by the ESI pattern.

As another variant, ESI patterns may map to differing sets of storage nodes. As a special case, consider an equipment rack of storage nodes with multiple disks (e.g., hard drives and/or SSD drives) associated with each storage node. For example, in an implementation of the foregoing, a storage system might include 1000 equipment racks having 40 storage nodes per rack with 50 disks per storage node. The ESI patterns utilized with such a storage system may, for example, comprise a set of 2000 ESI patterns, wherein each pattern maps one of its 1000 ESIs to exactly one disk within each of the 1000 equipment racks, i.e., each ESI pattern maps to 1000 disks, wherein each disk is within a storage node in a different equipment rack, and exactly one ESI pattern maps to each disk. As another example, the ESI patterns may comprise a set of 40 ESI patterns, wherein each pattern maps one of its 1000 ESIs to exactly one storage node within each of the 1000 equipment racks, i.e., each ESI pattern maps to 1000 storage nodes, where each storage node is within a different equipment rack, and exactly one ESI pattern maps to each storage node. The repair process for at most one ESI pattern may be active at a time, for example, and thus most of the infrastructure within an equipment rack may be powered down, thus requiring substantially less peak power. For example, at most one disk within the equipment rack is active at any point in time for the set of 2000 ESI patterns mapping to disks, or at most one storage node within an equipment rack is active at any point in time for the set of 40 ESI patterns mapping to storage nodes. It will readily be appreciated that there are many variants of the foregoing techniques, including mapping ESI patterns to overlapping sets of storage nodes or disks, etc.

In a variant of a distributed ESI pattern embodiment, wherein a fragment is stored on each storage node for each source object, there is a different ESI pattern ESIpat(I) assigned to each storage node I and a subset of the source objects O(I) assigned to each storage node, wherein approximately an equal amount of source object data is assigned to each storage node. The sets ESIpat(I) may, for example, be determined in a coordinated way for different storage nodes I, as described above. Each storage node I may be responsible for operating the repair process for the source objects O(I) and storing generated repair fragments according to ESI pattern ESIpat(I). Each storage node I may also be responsible for executing the verification resiliency test for the ESI pattern ESIpat(I). If at any point in time the verification resiliency test fails at a storage node I, storage node I may redistribute repair responsibility for the source objects O(I) to the other storage nodes in the storage system (e.g., with an indication that the source objects O(I) are in need of emergency repair). The other storage nodes that receive the responsibility for repair of the source objects O(I) may thus schedule the repair of source objects O(I) received from storage node I (e.g., schedule repair as soon as possible, potentially using more than the usual amount of repair bandwidth during the emergency repair). Once the redistributed repair finishes, the responsibility for repair of source objects O(I) may be returned to storage node I. In accordance with an alternative embodiment for the foregoing, the repair responsibility for source objects of O(I) remains with the storage nodes to which they were redistributed, and the ESI pattern used for storage of the source object is changed to that of the storage node to which they are redistributed (e.g., during the redistributed repair, the ESI pattern for the source object may be changed to the ESI pattern of the storage node performing the repair).

Embodiments of storage system 200 implement a fragment pre-storage technique, as described in the above patent application entitled "SYSTEMS AND METHODS FOR PRE-GENERATION AND PRE-STORAGE OF REPAIR FRAGMENTS IN STORAGE SYSTEMS," to generate a number of fragments for a particular source object that is greater than the number of storage nodes used to store the fragments (e.g., greater than the number of storage nodes in the storage system for certain large erasure codes). The fragments generated that do not have a corresponding assigned storage node for their storage at the time of their generation are thus "pre-generated" and "pre-stored" (e.g., in unused space then being utilized as "virtual" storage) for later moving to an assigned storage node (e.g., a storage node subsequently added to the storage system). In another variant utilizing ESI patterns herein in combination with such a fragment pre-storage technique, for each storage node I there is an ESI pattern PESIpat(I) assigned as the permanent ESIs to current available storage nodes to be utilized for source objects assigned to storage node I, a set of future ESIs FESIpat(I) to be utilized for source objects assigned to storage node I, and a subset of the source objects O(I) assigned to storage node I, wherein approximately an equal amount of source object data is assigned to each storage node and the objects O(I) assigned to storage node I have fragments stored among the current available storage nodes according to the ESI pattern PESIpat(I). The ESI sets PESIpat(I) and FESIpat(I) may be determined in a coordinated way for different storage nodes I, as described above, and generally these sets are disjoint. Each storage node I may be responsible for operating the repair process and pre-generating repair fragments associated with the set of future ESIs FESIpat(I) and source objects O(I) assigned to storage node I and storing the repair fragments locally at the storage node I in virtual storage. When a new storage node J is added to the storage system, each storage node I may be responsible for assigning an ESI X from FESIpat(I) as its permanent ESI for storage node J, thus extending PESIpat(I) to map ESI X to storage node J. Additionally, each storage node I may also be responsible for moving the repair fragments associated with ESI X from virtual storage on storage node I to permanent storage on the new storage node J. Each storage node I may further be responsible for executing the verification resiliency test for PESIpat(I) (e.g., when a storage node fails and thus PESIpat(I) loses the ESI assigned to the failed storage node, the verification resiliency test can be executed on the reduced PESIpat(I)). If at any point in time the verification resiliency test fails at a storage node I, the storage node I may redistribute repair responsibility for the source objects O(I) assigned to the storage node to the other storage nodes in the storage system (e.g., with an indication that the objects so redistributed are in need of emergency repair). The other storage nodes that receive the redistributed responsibility for repair of the source objects that need repair schedule the repair of source objects O(I) received from storage node I (e.g., schedule repair as soon as possible, potentially using more than the usual amount of repair bandwidth during the emergency repair). Once the repair finishes, the responsibility for repair of the redistributed source objects may be returned to storage node I. In accordance with an alternative embodiment for the foregoing, the repair responsibility for the source objects remains with the storage nodes to which they were redistributed, and the ESI pattern used for storage of the source object is changed to that of the storage node to which they are redistributed (e.g., during the redistributed repair, the ESI pattern for the source object may be changed to the ESI pattern of the storage node performing the repair).

In still another variant utilizing ESI patterns herein in combination with such a fragment pre-storage technique, in some cases a collection of source objects may have the nesting property S(0) subset S(1) subset S(2) subset . . . S(Z), where each set S(I) is a set of ESIs, and where S(0) is the set of ESIs for available fragments for the objects with the least number of available fragments, S(1) is the set of ESIs for available fragments for objects with the second least number of fragments, etc. In this case, the verification resiliency test may be run on the set S(0), and if the test passes then no further testing is needed since the test is also guaranteed to pass on S(1), S(2), . . . , S(Z). However, if the verification resilience test fails on S(0), then the test can be run on S(1), and if the test fails on S(1) then the test can be run on S(2), until the smallest index I is determined wherein the test fails on S(I) but passes on S(I+1). It should be appreciated that a sequential search, a binary search or other methods may be used to determine the smallest index I according to embodiments. Irrespective of the technique used to determine I, the set of source objects that may require emergency repair may be identified as those associated with the sets S(0), . . . , S(1), but potentially excluding source objects associated with S(I+1), S(Z). An advantage of this extension of the embodiments is that there may be substantially less source objects needing emergency repair (i.e., those associated with S(0), . . . , S(I), as opposed to all objects), which can substantially reduce the amount and duration of emergency repair needed. For example, it may be typical that the verification resiliency test passes for S(1) when the test fails on S(0), and it may also be typical that there is an equal amount of source object data associated with each of S(0), S(1), . . . , S(Z). Thus, the fraction of source object data needing emergency repair in this example may be a 1/Z fraction of the source object data within the collection of source objects, wherein for example Z may equal 800 for a k=2000, r=1000, and n=3000 liquid storage system, i.e., Z is at most r but may be a substantial fraction of r.

For an example of a combination of aspects of some of the foregoing techniques, consider a liquid storage system with k=2000, r=1000, and n=3000. For the variant described above with respect to a distributed ESI pattern embodiment, there are 3000 ESI patterns, one for each of the 3000 storage nodes. In this example, each storage node I is assigned source objects O(I) that are in aggregate approximately 1/3000 the size of all the source object data, and each storage node I may execute a repair process for O(I) using its assigned ESI pattern ESIpat(I) to determine how to store fragments on the storage nodes. Additionally each storage node I may execute verification resilience tests for ESIpat(I). Where for each storage node I the collection of source objects O(I) assigned to storage node I have the nesting property, and S(0,I), S(1,I), . . . , S(Z,I) are the corresponding nested sets of ESIs, if the verification resiliency test fails at some point in time, it may fail for one (or a handful) of storage nodes, and for one (or a handful) of the corresponding nested sets of ESIs. If, at some point in time, the verification test fails for exactly one storage node I and for exactly one set of ESIs S(0,I), then the fraction of source objects for which this triggers emergency repair is approximately a 1/3,000*1/800 fraction (assuming Z=800 and source objects are equally distributed amongst S(0,I), S(1,I), . . . , S(Z,I)), or a 1/2,400,000 fraction of the source object data overall. If, for example, there are 100 terabytes of source object data stored at each storage node, so that overall there is 200,000 terabytes of source object data stored in the storage system (100 TB*k), then the size of the source objects which need emergency repair is less than 100 gigabytes. When this emergency repair is redistributed amongst the 3000 available storage nodes, each storage node performs emergency repair on less than 33 megabytes of source object data.

More generally the embodiments described above can be applied to a general set of objects O that may or may not have the nesting property. For example, a set of ESIs S may be identified that are commonly available for the objects of O, and a verification resiliency test may be applied to S. If the verification resiliency test on S passes then no further verification resiliency testing for the objects may be implemented according to embodiments. If the verification resiliency test on S fails then another set of ESIs S' (where for example S' may be a superset of S) may be determined that are commonly available for a subset O' of the objects of O, and the verification resiliency test may be applied to S' in operation according to embodiments. If the verification resiliency test on S' passes then emergency repair may be implemented only for the objects of O-O'. This process may be repeated to find an S' of commonly available ESIs for a set O' so that the verification resiliency test on S' passes and so that the number of objects in O-O' is as small as practical. In this case, emergency repair for at least some of the objects of O-O' may commence before the verification resiliency test on S' completes. Thus verification resiliency testing for sets of fragments commonly available for subsets of a set of source objects can be used to verify decodability of a substantial number of objects of the set of objects, and thus can be used to identify a substantial number of objects of a set of source objects that do not need emergency repair. Additionally or alternatively, verification resiliency testing can be used to identify as few as possible objects of a set of source objects that may need emergency repair.

If objects are of different sizes, then the above embodiments can be modified to take into account varying object sizes (e.g., the verification resiliency testing process may be repeated to find an S' of commonly available ESIs for a set O' so that the verification resiliency test on S' passes and so that the aggregate size of the objects in O-O' is as small as practical). Thus verification resiliency testing can be used to identify a subset of a set of source objects that may need emergency repair such that the aggregate size of the objects in the subset is as small as practical.

Irrespective of whether multiple data storage patterns are utilized and/or the particular configuration of the one or more data storage patterns used, with the aforementioned redundancy margin (Y) it is possible to efficiently determine that the code can withstand certain storage node loss events without data loss using verification of code resiliency techniques herein. The particular number of additional fragments for such forward checking analysis (e.g., prospective number of storage node or fragment losses, L) may be selected based upon a known or predicted failure rate of the storage nodes storing the fragments, and thus the analysis may be utilized to conclude that the storage system is or is not at risk of loss of source data within a forward looking window of operation, for example. In practice, a larger value of L provides better assurance that future storage node failures will not result in unrecoverable objects. However, a larger value of L generally leads to more complexity to check that any pattern of L storage node failures will not result in unrecoverable objects. Thus, in embodiments, a value of L can be chosen to be large enough so that if the forward checking testing fails then the repair policy can quickly repair objects most at risk of being unrecoverable before those objects become unrecoverable, while at the same time choosing L small enough so that the forward checking can be done in a reasonable amount of time using a reasonable amount of computing resources.

Where the number of additional storage node losses, L, is determined to be unacceptably low (e.g., 0, 1, 2, . . . ) by a data integrity forward checking function of embodiments, logic of the storage system (e.g., logic of large erasure code storage control 250) may operate to take remedial action. For example, embodiments may implement emergency or expedited repair processes or otherwise change one or more operational parameters of the repair policy (e.g., dynamically increase the repair bandwidth (R) to expedite repairs, prioritize repair of certain source objects, increase a target or minimum redundancy (Y) metric, increase the total number of encoded fragments (n), makes copies of critical fragments, verify the existence of geo-redundant copies or data, etc.).

Comprehensive Analysis Logic

The foregoing data integrity forward checking functionality of embodiments may be implemented using comprehensive analysis logic (e.g., logic of data integrity forward checking logic 256) which identifies (e.g., using the fragment ESIs) a set of source object fragments for data integrity checking (e.g., the available, k+Y, fragments for a source object most at risk, such as a fragment at the head of a repair queue). The comprehensive analysis logic may operate to decode all combinations (decode test subsets) of the set of available fragments (k+Y fragments) having some number of additional losses (e.g., a number of storage node losses, L, for which data integrity is to be determined). In operation, such logic may take the set of available fragments (k+Y fragments, identified by their ESIs), take the desired number of additional lost fragments (L storage node losses) out of the set of available fragments and attempt to decode the source data. This attempted decoding would be repeated for every combination of the additional lost fragments removed from the set of available fragments. Accordingly, it can be appreciated that the number of foregoing decode test subsets may be represented by a Choose Function as: ((k+Y) choose (L)), which is the number of ways of choosing L elements out of a set of k+Y elements.

It should be understood that, in operation of embodiments of data integrity forward checking functionality, the source data may not actually be decoded since it is sufficient to verify that it could be decoded if desired. For example, this verification may comprise determining satisfaction of a rank condition on the set of linear combinations of the source data encompassed by the available fragments. The rank condition amounts to determining invertibility of the mapping from the source data to the available fragments. Actual decoding comprises performing the inversion on the data and this step is not needed to verify decodability. Accordingly, reference to attempted decoding according to embodiments herein refers to the operation of verifying decodability, whether or not the source data is actually decoded. Typically, the fragment information needed to verify decoding is the set of ESIs corresponding to the set of fragments for which decodability is to be verified.

If the source data is decodable for each of the combinations of the decode test subsets, then the data integrity checking logic of embodiments may conclude that the selected number of additional losses (L) can be tolerated without loss of data. If, however, the source data is not decodable for any of the combinations of the decode test subsets, then the data integrity checking logic of embodiments may conclude that the selected number of additional losses (L) cannot be tolerated without loss of data.

In another example of a comprehensive analysis technique for determining data integrity according to embodiments, let the erasure code utilized (e.g., an (n; k; r) erasure code) be represented as $\mathcal{C}$', where for some subset $I \subseteq [1:n]$ of size (k+Y) the comprehensive analysis logic considers restriction of the code $\mathcal{C}$' to the coordinate positions picked by I. Let $\mathcal{C}$'' represent the resulting [t; k] code, where t=|I|=k+Y. In operation the comprehensive analysis logic may verify whether $\mathcal{C}$'' can tolerate every pattern of up to L losses of fragments. For example, a k×t generator matrix G of $\mathcal{C}$'' may be constructed (e.g., a matrix of rank k whose row span is the set of the codewords of $\mathcal{C}$'') by the comprehensive analysis logic. The generator matrix G may be constructed, for example, by encoding $e_1, \ldots, e_k$, where $e_i$ is the $i^{th}$ elementary basis vector, and arranging the resulting codewords as the rows of G. The rank of every sub-matrix of G may be obtained by removing L of the columns. The comprehensive analysis logic may verify the data integrity with the loss of the L fragments by confirming that the resulting columns after having removed L columns have rank k. For example, if for some pattern of removal of L columns the remaining columns have rank less than k, the comprehensive analysis logic may conclude that the selected number of additional losses (L) cannot be tolerated without loss of data.

Although the foregoing comprehensive analysis techniques provide data integrity checking as may be utilized to provide forward looking determinations regarding the recoverability of data, such comprehensive analysis techniques may not be well suited for all situations. For example, a prototypical setting with respect to a storage system configuration may provide for n≈1400, k≤1000, x≈4, Y≈100, and L≈5. The combinations for the decode test subsets of a comprehensive analysis technique may thus be on the order of 1.3299296e+13 (e.g., as may be determined using the Choose Function ((k+Y) choose (L))). The forgoing operation to analyze the decode ability of such a large number of combinations presents issues with respect to computing resource utilization and time for data integrity determinations. Accordingly, embodiments may implement data integrity checking techniques that are adapted for computational efficiency.

Generic Verification of Coding Resiliency

Figure 3:
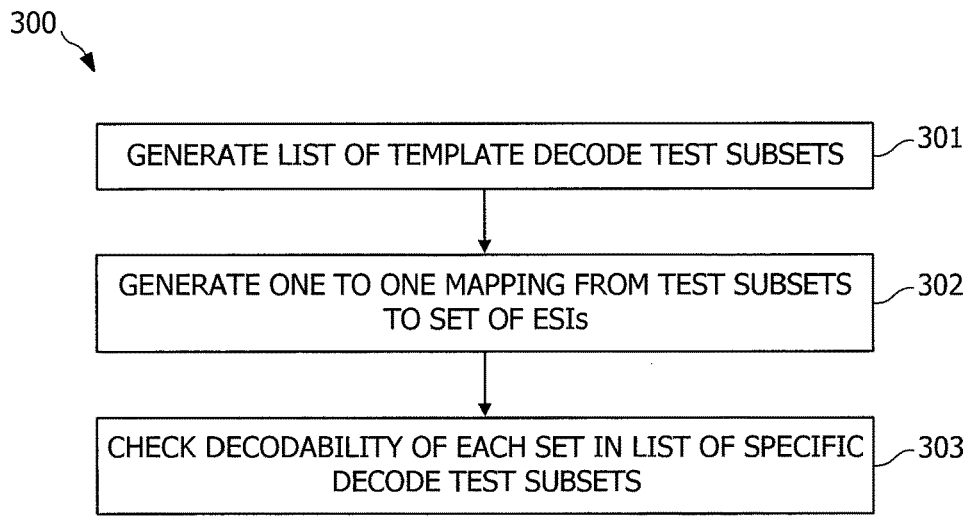
FIG. 3 shows a high level flow diagram of a verification of coding resiliency process according to embodiments of the present disclosure.

A generic verification of coding resiliency process that has many advantages is to use the following general framework to break the process into several steps. Flow 300 providing an embodiment of such a generic verification of coding resiliency process is shown in FIG. 3. A first step of the generic verification of coding resiliency process of flow 300, hereafter referred to as a GenTemplate process, is to generate a list of template decode test subsets against which decodability tests can be performed (block 301). The input to GenTemplate comprises parameters such as A=k+x, B=k+Y, and L. The output of GenTemplate comprises a list T(1), T(2), T(3), . . . , T(M) of template decode test subsets, where each template decode test subset T(i) comprises a subset of Bset={1, 2, 3, 4, . . . , B}. The output of GenTemplate may also comprise auxiliary output as described in further detail below. A GenTemplate process is generally executed as a pre-processing step (but in some cases can be executed concurrently with the other steps). For example, a GenTemplate process can be run before the particular ESIs corresponding to commonly available set of fragments for a set of objects is available or known, and thus operation of GenTemplate of embodiments does not have to be low complexity, and does not have to be a real-time process. Thus, for example, the output of GenTemplate may be generated and saved as a file or object for use in the future.

A second step of the generic verification of coding resiliency process of flow 300, hereafter referred to as a MapTemplateToSpecific process, is to generate a one-to-one mapping $f$ from Bset to a set of S of ESIs (block 302), where the cardinality of S is at least B. The input to MapTemplateToSpecific comprises a value of B and a set S of at least B ESIs. The input to MapTemplateToSpecific also comprises a list $T(1)$, $T(2)$, $T(3)$, ..., $T(M)$ of template decode test subsets generated by GenTemplate and may also comprise other auxiliary output from GenTemplate, which may provide MapTemplateToSpecific guidance about how to determine $f$ based on properties of S relative to a list $T(1)$, $T(2)$, $T(3)$, ..., $T(M)$ of template decode test subsets generated by GenTemplate. There also may be other auxiliary inputs to MapTemplateToSpecific, for example the physical locations of nodes storing fragments associated with the ESIs of S and the network connection topology between such nodes, or, as another example, a description of the correlations in possible failures between nodes storing fragments associated with the ESIs of S. MapTemplateToSpecific determines the function $f$ that maps Bset to S. MapTemplateToSpecific can determine a list $S(1)$, $S(2)$, $S(3)$, ..., $S(M)$ of S-specific decode test subsets to test for decodability, determined as $S(i)=\{f(j):j$ in $T(i)\}$ for all $i=1, ..., M$. MapTemplateToSpecific is generally executed on a set S of ESIs corresponding to a commonly available set of fragments for a set of objects for which verification of coding resiliency is desired. Thus, generally MapTemplateToSpecific is executed in real-time based on a set S, and generally MapTemplateToSpecific is a very low complexity process. Note that a MapTemplateToSpecific process using a same list of template decode test subsets $T(1)$, $T(2)$, $T(3)$, ..., $T(M)$ may be applied to different sets S of ESIs to produce different lists of S-specific decode test subsets. Thus, in some embodiments, GenTemplate may be executed once in a preprocessing step to produce a list of template decode test subsets, and this list of template decode test subsets may be used as part of the verification of coding resiliency process for all sets S of ESIs to be tested.

A third step of the generic verification of coding resiliency process of flow 300, hereafter referred to as a CheckSpecific process, is to check decodability of each set $S(i)$ in a list of S-specific decode test subsets. The input to CheckSpecific comprises a list of S-specific decode test subsets (block 303). The check for decodability is erasure code specific, and generally involves executing a process or method that is specific to the properties of the erasure code (e.g., the check for decodability can be used to determine whether or not the erasure code would be able to decode data associated with a particular set of ESIs). The output of CheckSpecific may comprise "pass" if decodability is verified for each decode test subset in the list and "fail" if decodability is not verified for at least one decode test subset in the list. Alternatively, or in addition, the output of CheckSpecific may comprise more detailed information, such as the number of decode test subsets for which decodability could not be verified, or a full or partial list of decode test subsets for which decodability could not be verified.

As one skilled in the art will recognize, there are many variants of a generic verification of coding resiliency process. As an example, steps may be combined in some embodiments (e.g., MapTemplateToSpecific and CheckSpecific may be combined into one step). As another example, some parts of a step may be moved to a different step (e.g., CheckSpecific may determine the list of S-specific decode test subsets from the list of template decode test subsets, instead of MapTemplateToSpecific). As another example, a list of template decode test subsets may be represented in other forms, such as a compressed format, that may be more suitable for storing and/or processing.

Applying Generic Verification of Coding Resiliency to Comprehensive Analysis Logic A generic verification of coding resiliency process, such as that illustrated in flow 300 of FIG. 3, can be applied to a comprehensive analysis logic embodiment as follows. The input to GenTemplate can be $B=k+Y$, and L. GenTemplate can generate a list of all $M=(B$ choose $L)$ subsets of Bset=$\{1, 2, 3, 4, ..., B\}$ of size B-L, and this is the list $T(1)$, $T(2)$, $T(3)$, ..., $T(M)$ of template decode test subsets. Given a set S of ESIs, MapTemplateToSpecific can generate the map $f$ from Bset to the first B ESIs of S, and determine the list $S(1)$, $S(2)$, $S(3)$, ..., $S(M)$ of S-specific decode test subsets derived from $T(1)$, $T(2)$, $T(3)$, ..., $T(M)$. CheckSpecific can then check for decodability of $S(1)$, $S(2)$, $S(3)$, ..., $S(M)$. This is a simple example of generic verification of coding resiliency, wherein for example the GenTemplate is of such low complexity that it can be executed concurrently with the other steps of the overall process, and in which the lists may not be explicitly represented, but instead generated on-line during the execution of the steps.

There are many alternative embodiments. For example, a list of template decode test subsets may be represented differently (e.g., a template decode test subset may comprise a set of L members of Bset to exclude from Bset when testing decoding). As another example, MapTemplateToSpecific can generate the map $f$ from Bset to a randomly or pseudo-randomly chosen subset of S. As another example, MapTemplateToSpecific can determine several mappings $f_1$, $f_2$, $f_3$, etc., and generate the corresponding list of S-specific decode test subsets associated with each such mapping. In this example, CheckSpecific may check decodability for each list of S-specific decode test subsets, and may determine that the verification of coding resiliency test is passed for a specific set S of ESIs if the test is passed for any of the lists of S-specific decode test subsets.

Group Analysis Logic

Accordingly, the foregoing data integrity forward checking functionality of embodiments may be implemented using group analysis logic (e.g., logic of data integrity forward checking logic 256) that identifies (e.g., using the fragment ESIs) the available fragments (e.g., k+Y fragments) and partitions those available fragments into some number, g, of groups. Operation of group analysis logic of embodiments, although still decoding combinations of fragments to determine data integrity, does so in an adroit manner using the aforementioned groups to avoid decoding all combinations of the decode test subsets of the comprehensive analysis logic. For example, instead of checking every possible subset of fragments (e.g., every combinations of L fragments removed from the k+Y available fragments, as in a comprehensive analysis), embodiments of a group analysis consider every possible subset of L groups of the g groups, and verify whether erasure of all the fragments in those L groups can be tolerated. Each such subset of L groups may be thought of as a "rack" and the analysis according to embodiments confirms that failure of every set of racks can be tolerated. It should be appreciated that passing a test where any L of g groups of storage nodes (and corresponding fragments of objects) can be removed and ensured that objects are recoverable is a stronger requirement than tolerating erasure of every L fragments. For example with group analysis logic, if s is the size of each group and if the test passes then up to L·s, storage nodes may fail (any subset of the storage nodes in each of L groups may fail) with the assurance that the objects are still recoverable, and thus the assurance is stronger than the assurance with comprehensive analysis logic that any L storage nodes may fail.

Thus, the group analysis logic may operate to dramatically reduce the number of decode test subsets (where, as described above, decode test subset here refers to verification of decodability) used to verify data integrity, so much so that embodiments may operate in real-time or near-real-time to provide determinations regarding whether the storage system is susceptible to data loss due to a particular number (L) of storage node failures. Moreover, as will be appreciated from the discussion that follows, such group analysis techniques provide robust information regarding the data integrity and failure susceptibility, such as to provide information regarding a number of sets of a particular number of storage nodes which may fail and still the source data remains decodable.

An exemplary configuration of a group analysis technique as may be implemented by data integrity forward checking logic 256 of embodiments verifies that the source data as stored in k+Y available fragments remains decodable when any L fragments are lost. In operation of embodiments, k+x is a minimum number of fragments used to check decodability, wherein x<Y. The group analysis logic partitions the k+Y available fragments into g groups, such as based upon the particular number of storage node failures, L, to be analyzed, the number of available fragments for a source object, k+Y, the storage system repair policy redundancy metric, Y, and/or the number of additional fragments used to decode the source data, x. For example, the available fragments may be partitioned into g groups, of size s=(Y−x)/L in accordance with g=(k+Y)/s=L·(k+Y)/(Y−x). This ensures that the size of the union of any g−L groups is at least k+x (i.e., (g−L)·s is at least k+x, assuming non-overlapping groups), and more generally any grouping that satisfies the condition that the size of the union of any g−L groups is at least k+x can be used. To simplify the presentation we make the assumptions that (Y−x) is divisible by L and that (k+Y) is divisible by s in this example, and as one skilled in the art will recognize the methods described herein can be modified to remove these assumptions. The group analysis logic may then check the decodability of each decode test subset, S', of g—L groups, wherein each set, S', comprises at least k+x fragments. That is, for each set, S', of g−L groups, the group analysis logic of embodiments is removing the fragments associated with the L groups and determining if the remaining fragments are decodable, and doing this for each combination of sets, S', of g−L groups (i.e., a number which is significantly smaller than the number of combinations of the additional lost fragments, L, removed from the set of available fragments, k+Y, as performed by embodiments of a comprehensive analysis technique).

Applying Generic Verification of Coding Resiliency to Group Analysis Logic

A generic verification of coding resiliency process, such as that illustrated in flow 300 of FIG. 3, can be applied to a group analysis logic embodiment as follows. The input to GenTemplate can be A=k+x, B=k+Y, and L. GenTemplate can use the methods described above to determine a group size s and a number of groups g, wherein s=(B−A)/L and g=B/s. To simplify the presentation, make the assumptions that (B−A) is divisible by L and that B is divisible by s in this example, and as one skilled in the art will recognize the methods described herein can be modified to remove these assumptions. GenTemplate can partition Bset={1, 2, 3, 4, ..., B} into g groups $G_1, G_2, G_3, \ldots, G_g$, wherein $G_i=\{(i-1)*s+1, (i-1)*s+2, \ldots, i*s\}$, for i=g, and $G_1, G_2, G_3, \ldots, G_g$ can be part of the auxiliary output of GenTemplate. GenTemplate can generate a list of M=(g choose L) template decode test subsets as follows: for each subset I={i(1), i(2), i(g−L)} of the M subsets of gset={1, 2, 3, 4, ..., g} of size g—L, GenTemplate can determine a template decode test subset TO as the union of $G_{i(1)}$, $G_{i(2)}, \ldots, G_{i(g-L)}$.

From an input set S of at least B ESIs and the g groups $G_1$, $G_2, G_3, \ldots, G_g$, MapTemplateToSpecific can generate the map $f$ from Bset to the first B ESIs of S. MapTemplateToSpecific may take into account the physical layout of where the fragments associated with the ESIs of S are stored within the storage system when determining $f$. For example, MapTemplateToSpecific may prefer that $f$ maps a single group to ESIs for fragments that are stored within the same rack within the storage system. MapTemplateToSpecific can determine the list S(1), S(2), S(3), ..., S(M) of S-specific decode test subsets from input T(1), T(2), T(3), ..., T(M).

CheckSpecific can then check for decodability of S(1), S(2), S(3), ..., S(M) using a procedure that may depend on the particular properties of the erasure codes used with the system. This is an example of generic verification of coding resiliency, wherein for example the GenTemplate is of such low complexity that it can be executed concurrently with the other steps of the overall process, and in which the lists may not be explicitly represented, but instead generated on-line during the execution of the steps.

There are many alternative embodiments. For example, MapTemplateToSpecific may receive the parameters g and s as input to determine the g groups $G_1, G_2, G_3, \ldots, G_g$, instead of receiving the g groups $G_1, G_2, G_3, \ldots, G_g$ as input. As another example, a list of template decode test subsets may be represented differently (e.g., a template decode test subset may comprise a set of L of the g groups, wherein the union of these L groups are to be excluded from Bset when testing decoding). As yet another example, MapTemplateToSpecific can generate the map $f$ from Bset to a randomly or pseudo-randomly chosen subset of S, taking into account the group structure $G_1, G_2, G_3, \ldots, G_g$, of Bset.

Covering Based Group Analysis Logic

Further increases in the speed at which analysis of the forward checking provided according the embodiments may be obtained by a refined grouping technique based on coverings. Let L'>L, and suppose that g and s are chosen in such a way that size of the union of any g−L' groups is at least k+x. Let Q(1), ..., Q(M) be a collection of M subsets of groups, each Q(i) a set of L' groups, and chosen in a way such that any set of L groups is a subset of some Q(i). Then it suffices to check for each i=1, ..., M, that the fragments in the g−L' groups not contained in Q(i) are decodable.

A collection {Q(1), ..., Q(M)} is known as a covering design with parameters (g, L', L) in the literature of combinatorial designs. The efficiency of the foregoing embodiment depends directly on M, and thus a covering design with an M as small as possible may be desired. Although an exact achievable value of M may not be known in general, a trivial lower bound is (g choose L)/(L' choose L). Another bound due to Schoenheim, well-known in the field of combinatorics, is slightly tighter. The construction of good covering designs is in general a computationally expensive process, but once a covering has been computed, it can be reused indefinitely. Thus, the process of creating a covering may be implemented as a preprocessing step that is executed ahead of time according to embodiments. The La Jolla Covering Repository (http://www.ccrwest.org/cover.html) provides a database of coverings that may be utilized for a variety of parameters.

The choice of L' involves a tradeoff in implementations according to embodiments. Smaller values of L' result in covering parameters which are more manageable. Thus it is easier to construct a suitable covering of good quality (with a small M) for such parameters. However, larger values of L' result in a potentially much faster forward checking procedure, if a suitable small covering can be constructed. The preprocessing task of deriving a suitable covering is expected to be much more computationally intense for large values of L' than for smaller values of L'.

It should be appreciated that calculating coverings may be computationally expensive. The following method (called the greedy method) provides a relatively efficient technique for calculating coverings according to embodiments herein. Below, an L-set is taken to be a subset of size L of a given set, and n is the number of L-sets in $\{1, \ldots, g\}$. In other words, n=(g choose L). Write ord(x) to denote an arbitrary (but fixed) 1-to-1 mapping of the L-sets into the integers $\{1, \ldots, n\}$.

---

Let $a_1,\ldots,a_n$ be a random permutation of all the L-sets in $\{1, \ldots, g\}$.
Let c[1], ..., c[n] be an array whose members are initialized to zero.
M = 0
For i = 1, ..., n, do
    if c[ord($a_i$)] = 0, then
(SEL)    Select an L'-set in $\{1, \ldots, g\}$ that is a superset of $a_i$
    Let u be that selected L'-set
    For each L-set v that is a subset of u, do
        Increment c[ord(v)]
    End for
    M = M + 1
    Q(M) = u
    End if
End for
Return r

---

It should be appreciated that the execution of the above algorithm will produce a correct covering (i.e., the procedure guarantees that every L-set in $\{1, \ldots, g\}$ will be covered by at least one of the L'-sets Q(1), ..., Q(M)). The array c[ ] is such that c[ord(x)] contains a count of how many times the L-set x is covered. After the i-th iteration it is guaranteed that c[ord($a_i$)]>0, and thus all the c[ ] are non-zero when the method terminates, implying that every L-set is covered.

Several techniques may be used to select an L'-set in the step labeled (SEL). One technique is to take a random superset of $a_i$ of size L', leading to a fairly fast procedure. Another technique is to create a number k of random candidate supersets. Here, k is a configurable parameter. Among the k candidate supersets, the one that covers the largest number of previously not covered L-sets may then be selected. Note that the availability of c[ ] makes it relatively easy to find the best candidate. The parameter k can be varied to select the desired tradeoff: Larger values of k lead to better coverings at the expense of higher computation cost. Another technique is to proceed iteratively, such as to generate k supersets of $a_i$ of size L+1 at random, wherein the best supersets among the generated supersets may be selected. That new set can then be extended by another member to obtain a set of size L+2, again by choosing the best among k candidate sets. The process may be iterated until a set of size L' is constructed. One further technique is to select the L'-set by exhaustively evaluating all the supersets of $a_i$, and picking the best candidate. This approach can be even more costly, but results in high quality solutions.

It should be appreciated that the selection procedure in the step labeled (SEL) does not need to be the same in each iteration. In fact, in the early iterations, almost any L'-set will newly cover (L' choose L) L-sets, which is best possible (in the sense of the greedy method). Thus in the early stages, the random superset procedure may be just as good as more elaborate selection procedures, and much faster. But as the method progresses, it becomes more and more difficult to add new L'-sets that cover many L-sets, and thus it may be advantageous to use better selection algorithms towards the end of the algorithm, to offset this effect to some extent. In some cases, it is practical to add the last few covering sets with exhaustive search, when doing this over the whole process may otherwise be prohibitively expensive.

Note also that this method can be advantageously combined with other processes. For example, given a partial covering, a method very similar to the above can be used to compute a complete solution: to achieve this, the array c[ ] needs to be correctly initialized for the given partial solution. Furthermore, the procedure can be used to create a partial solution itself, by terminating the main iteration early. These properties make the procedure amenable to combinations with other approaches. For example, the greedy method can be used to create a partial solution, which can then be improved with other methods, which can in turn then be completed again with the greedy method. Multiple such iterations are possible.

To illustrate the approach, suppose that an optimization algorithm is available to improve on a partial covering. For example, simulated annealing can be used to reduce the number of non-covered L-sets in a given partial solution by changing the covering sets (without changing the number of covering sets). The method above can then be combined with simulated annealing to produce a good covering: First, the greedy method may be used to produce a partial solution. This solution may then be improved with simulated annealing. In a second step, the new partial solution may then be extended to a larger but still partial solution and the optimization process repeated, and so on, until a complete covering is achieved. The one skilled in the art will recognize that it is possible to bias the simulated annealing process to mostly or exclusively operate on the newly added covering sets in each step, making it much more effective than when applied to the whole covering.

The decision of when to switch algorithms can be made in an ad hoc fashion, or automatically based on certain criteria. For example, a predetermined "schedule" sequence of operations could be created, indicating the amount of work to perform in each stage (e.g. how many sets to add with the greedy method with what set selection method or how many simulated annealing iterations to perform at what temperature, etc.). Alternatively, a dynamic approach can be implemented, such as to execute simulated annealing for as long as it yields noticeable improvements, and switch back to the greedy method to complete the set after.

Applying Generic Verification of Coding Resiliency to Covering Based Group Analysis Logic A generic verification of coding resiliency process, such as that illustrated in flow 300 of FIG. 3, can be applied to a group analysis logic embodiment as follows. The input to GenTemplate can be A=k+x, B=k+Y, L and L'>L. GenTemplate determines g and s and g groups $G_1, G_2, G_3, \ldots, G_g$, wherein each group is a subset of Bset=$\{1, 2, \ldots, B\}$, in such a way that size of the union of any g–L' groups is at least A, and $G_1, G_2, G_3, \ldots, G_g$ can be part of the auxiliary output of GenTemplate. GenTemplate determines M and a covering design $Q(1), \ldots, Q(M)$, with parameters (g, L', L), which is a collection of M subsets of groups, each T'(i) a set of L' of the g groups, and chosen in a way such that any set of L of the g groups is a subset of some T'(i). Methods for determining such covering designs are described above. GenTemplate determines a list $T(1), \ldots, T(M)$, of M template decode test subsets, wherein $T(i)=Bset-\{\cap G(j): j \in Q(i)\}$.

From an input set S of at least B ESIs and the g groups $G_1, G_2, G_3, \ldots, G_g$, MapTemplateToSpecific can generate the map $f$ from Bset to the first B ESIs of S. MapTemplateToSpecific may take into account the physical layout of where the fragments associated with the ESIs of S are stored within the storage system when determining $f$. For example, MapTemplateToSpecific may prefer that $f$ maps a single group to ESIs for fragments that are stored within the same rack within the storage system. MapTemplateToSpecific can determine the list S(1), S(2), S(3), S(M) of S-specific decode test subsets from input $T(1), T(2), T(3), \ldots, T(M)$.

CheckSpecific can then check for decodability of S(1), S(2), S(3), . . . , S(M). This is an example of generic verification of coding resiliency, wherein for example the GenTemplate is of such high complexity that it is not desirable to execute GenTemplate concurrently with the other steps of the overall process, and instead execution of GenTemplate may be a preprocessing step, and the list T(1), T(2), T(3), . . . , T(M) may be explicitly represented and used to check decodability for a plurality of specific sets of ESIs using MapTemplateToSpecific and CheckSpecific.

There are many alternative embodiments. For example, MapTemplateToSpecific may receive the parameters g and s as input to determine the g groups $G_1, G_2, G_3, \ldots, G_g$, instead of receiving the g groups $G_1, G_2, G_3, \ldots, G_g$ as input. As another example, a list of template decode test subsets may be represented differently (e.g., a list may comprise $Q(1), \ldots, Q(M)$). As another example, MapTemplateToSpecific can generate the map $f$ from Bset to a randomly or pseudo-randomly chosen subset of S, taking into account the group structure $G_1, G_2, G_3, \ldots, G_g$, of Bset.

Examples of Group Analysis Logic

For an exemplary forward checking implementation, assume L=5 and x=4. Where k=1000 and Y=100 (as in the example discussed above with respect to an embodiment of comprehensive analysis logic), and thus B=k+Y is a lower bound on the number of available fragments), g=57 and thus 4.187106e+6 decode test subsets for decoding are presented. As can be seen in comparing this number to the 1.3299296e+13 combinations of decode test subsets in the exemplary comprehensive analysis above, significant computational efficiencies are achieved using such a group analysis technique. A grouping approach based on coverings can also be used. For example, suppose L'=6 is used. Then S=16 and g=69. The Schoenheim bound implies that in this case, at least about 1.9e+6 sets are needed for a covering, and this is also the number of decode test subsets. A simple procedure yields somewhat less than 2.3e+6 in a very reasonable time (i.e., in a matter of minutes on a standard PC). Larger values of L' require more preprocessing time but result in better potential savings. The most extreme choice in this example is L'=96; with s=1 and g=1100. A suitable covering in this case would have at least about 218000 vectors. Given such a covering, the forward checking procedure would only need to evaluate about 218000 decode test subsets.

As further examples, continuing with the assumption that L=5 and x=4, in the case where k=996, Y=104 (and thus B=k+Y is a lower bound on the number of available fragments), and g=55 then 3.478761e+6 decode test subsets for decoding are presented. If a covering based approach is used, L'=8 may be selected, in which case there are 92 groups of size 12 or 13 each. The covering is of a size of at least about 900000, and with a fast procedure to construct coverings, a size of about 1.8e+6 to 2.0e+6 can be easily achieved, resulting in that many decode test subsets for decoding being presented. The largest possible L' in this example, is 100 in this case, leading to coverings of a size of at least about 1.9e+5. In the case where k=986, Y=154, and g=38 then 5.019420e+5 decode test subsets for decoding are presented, or in the range of about 2.8e+4 to 2.3e+5 decode test subsets (dependent on the amount of precomputation) if coverings are used. In the case where k=2246, Y=254, and g=50 then 2.118760e+6 decode test subsets for decoding are presented, or in the range of 1.2e+5 to 1.0e+6 decode test subsets for decoding are presented if coverings are used.

From the foregoing, it can be appreciated that the exemplary embodiments of a group analysis technique take advantage of the data redundancy metric, Y, being significantly larger than the number of additional fragments, x, (in addition to k) used for decoding. That is, the larger the redundancy metric, Y, is relative to the lower bound B=k+Y on number of available fragments, the less the number of groups there are for checking according to embodiments (e.g., the number of groups, g, is related to the ratio of the minimal number of available fragments, B=k+Y, divided by the redundancy metric, Y, where Y is a lower bound on the number of fragments available beyond k). This is because it is expected that the source data can be recovered with a high probability if k+x fragments are used (x being a relatively small number, such as 2, 3, 4, etc.), but the storage system actually provides k+Y fragments for decoding (e.g., lazy repair policy logic 252 and/or repair bandwidth control logic 253 may operate to maintain a minimum redundancy of Y fragments for each source object stored by storage system 200). In operation, however, embodiments of data integrity forward checking logic 256 implementing a group analysis technique is tasked with checking that the storage system can lose any L (e.g., 5) of the k+Y (e.g., 1100) available fragments, whereas the number of available fragments can be as low as k+x (e.g., 1004) fragments and decoding can be achieved with a high probability. Taking advantage of the gap between the available redundancy (Y fragments) and the number of additional fragment losses to be considered (L), group analysis logic in essence operates to consider the loss of a number of fragments corresponding to this difference (e.g., Y–L rather than L, such as may be 95 rather than 5 in the foregoing example). Consideration of the loss of such a larger number of fragments (Y–L) encompasses the loss of the fewer number of fragments (L) and, when done in accordance with embodiments described herein, covers all the combinations of the loss of the fewer fragments (L) although only considering a much smaller number of cases. This is because if L fragments are lost, then there is some loss of fragments from at most L of the groups, and the group logic analysis includes the stronger checking of loss of all the fragments from these L groups.

Consider again the above example where L=5, x=4, k=2246, and Y=254. The combinations to consider for all possible combinations of 5 fragments being lost from 2500 available fragments is (2500 choose 5) or 8.1055143e+14 decode test subsets. However, in accordance with embodiments, the number of groups ($g = L \cdot (k+Y)/(Y-x) = 50$) to be considered is reasonably small, and thus considering the loss of L fragments using a group analysis technique presents only (50 choose 5) (i.e., (g choose L)) or 2.118760e+6 decode test subsets for decoding. Moreover, although the parameters are relatively large in this example, and thus the decode may be slower as compared to the above examples having smaller parameters (e.g., where k=1000 and Y=100, and thus B=1100), such a large parameter embodiment may nevertheless provide for the data integrity checking as quickly or more quickly than a small parameter embodiment in light of the appreciably smaller number of cases to be considered.

The particular groupings of fragments within the g groups, a minimum number of available fragments (B=k+Y) are portioned into according to embodiments may be selected or otherwise manipulated to provide various advantages and/or features for data integrity checking according to the concepts herein. For example, the groupings may initially be selected (e.g., randomly, quasi-randomly, etc.) and the foregoing decoding and source data recovery checking performed. If, however, the data recovery checking fails to recover the source data from the selected set of g groups, the groupings may be changed (e.g., shuffled, randomly reselected, quasi-randomly reselected, etc.) and the decoding and source data recovery checking performed using the new groupings. If the analysis of the changed groups confirms that the source data can be recovered from each group, the data integrity checking of embodiments may conclude that the selected number of additional losses (L) can be tolerated without loss of data. This regrouping can be performed as many times as desired, keeping in mind that all of these regroupings and retestings will fail if there are a set of L fragments whose loss does not allow the recovery of the source data. The assurance is that if the test is passed for any grouping then the loss of any L fragments does not make the source data unrecoverable (as well as the stronger assurance, that the loss of any L groups from the grouping for which the test passed does not make the source data unrecoverable).

In another example of embodiments, upon detection of non-decodability of a certain subset of fragments the grouping can be locally and temporarily adjusted. If in the verification test a set of L groups was assumed erased leaving k+x available fragments that were thereby determined to be undecodable, then, provided the L groups comprise more than L fragments (at least one group has more than one fragment) it may still be the case that the loss of any L fragments can be tolerated. One method to verify this is repartition the fragments comprising the L groups that have been assumed erased into L+1 or more groups. The system would then check whether any of L these new groups can be erased by adjoining the remaining groups to the aforementioned k+x fragments and checking decodability of the expanded set. In the case of L+1 groups in the repartition, this comprises L+1 additional decodability tests. It should be appreciated that the testing done with the extended set can reuse most of the computation already performed in the original decodability test and that it is only required to determine that the fragments adjoined from the additional group are sufficient to repair the rank deficiency of the originally tested subset. This approach has an advantage over the regrouping described above in that the decodability testing already performed with the initial grouping is not discarded. Further, it allows the testing procedure to in general operate with a smaller x since the effect of failing the decodability test is significantly muted. For example, if a subset of random k fragments fails decodability with a probability of 1 percent, then it is expected that the additional regrouping described here is applied in only 1 percent of the tests, which then represents a relatively small additional computational cost. If the number of decodability tests performed number in the millions then, with a 1 percent failure rate, some failure is virtually certain. Hence, with the previously described regrouping technique it may not be feasible to operate with x=0 because any failure of decodability restarts the testing process. Therefore, x should be chosen to be large enough so that the probability that all decodability tests on k+x fragments pass is reasonably large. The repartitioning into L+1 or more groups such as described here allows the testing to continue without restarting. In some cases, especially if Y is not very large, the ability to test at x=0 will be allow larger and hence fewer groups and therefore reduce the complexity of the complete verification process.

As another example of embodiments, of selecting or otherwise manipulating the groupings of fragments within g groups, the groupings may be organized in such a way as to have one or more groups correspond to groups of storage nodes sharing one or more attributes. For example, storage nodes that are within a same equipment rack may tend to fail together (e.g., the storage nodes may share a common point of failure, such as power supply, disk controller, server, etc.). By organizing the groupings corresponding to such a physical infrastructure level attribute the data integrity checking of embodiments provides a better indication of whether the storage system is susceptible to data loss (e.g., the data integrity checking analysis is aligned or more nearly aligned with actual failure scenarios).

For example, the number of groups g and the organization of the g groups can be aligned with the placement of the storage nodes within the system, e.g., storage nodes that reside within the same rack can be placed within the same group, and thus the checking analysis can verify that failures of up to L racks of storage nodes does not cause unrecoverable source data.

As another example, the checking analysis can use a combination of group checking analysis and a comprehensive checking analysis, where for example the checking for unrecoverable source data from failure of any L racks of storage nodes can be performed using group checking, whereas the checking for unrecoverable source data from failure of any L' individual storage nodes can be performed using comprehensive checking.

It should be appreciated that there may be appreciable overlap with respect to the particular fragments checked by the group analysis of embodiments. Accordingly, embodiments may operate to optimize the data integrity checking operation by identifying such overlaps and efficiently processing the fragments for checking (e.g., identifying a particular combination of fragments which has been considered by another case and not duplicating the checking processing for that combination).

For example when using comprehensive analysis logic, many patterns of loss of L storage nodes or fragments that have been checked for a given set of B=k+Y storage nodes do not have to be completely rechecked when one of these B storage nodes is lost and the number of storage nodes in the checked set of storage nodes is reduced by one to B−1=k+Y−1. For example, the additional work to check decodability for a pattern of loss of L storage nodes among the B−1 remaining storage nodes that have already been checked when the B storage nodes were checked may be substantially less than the work to check the pattern from scratch.

As another example, when using group analysis logic, the same groupings can be used in some cases when an additional storage node is lost, (i.e., as long as after the loss of the storage node it is still the case that any g−L groups still comprise at least k+x storage nodes). In this case, the patterns of grouping that exclude the group from which the additional storage node is lost do not need to be retested, and only the patterns of grouping that include the group from which the additional storage node is lost need to be retested. Thus, with group analysis logic, at most (g−1 choose L) patterns can be retested.

Exemplary embodiments of data integrity checking have been described above with reference to comprehensive analysis logic and group analysis logic configurations. It should be appreciated, however, that various alternatives and/or variations to the foregoing data integrity checking examples may be utilized in accordance with the concepts herein.

Parity Analysis Logic

Embodiments of a data integrity checking configuration may utilize parity analysis logic (e.g., logic of data integrity forward checking logic 256) which constructs a parity check matrix for determining if the source data can be recovered after a loss of a particular number of storage nodes. Such a parity check matrix may, for example, be utilized as an alternative to the generator matrix of a comprehensive analysis technique configuration discussed above. The parameters k, x, B=k+Y, and L are the same as previously defined.

In accordance with embodiments of a data integrity checking configuration utilizing parity analysis logic, tasks as described above with reference to a comprehensive analysis can be performed by constructing the parity check matrix H of $\mathcal{C}'$ instead of the generator matrix G. As described above, the codewords of $\mathcal{C}'$ may be the row span of G. Equivalently, the codewords of $\mathcal{C}'$ may be the right kernel of H. That is $\mathcal{C}'=\{c \in \mathbb{F}_q^B : Hc=0\}$. The parity check matrix H of embodiments has dimension Y×B, which in exemplary embodiments herein is approximately 10 times smaller than G. Thus, by using a pre-processing step to compute H (e.g., instead of the first step of the comprehensive analysis described above) embodiments may work on a much smaller matrix (e.g., 100×1100 instead of 1000×1100). When the number of erasures (fragment losses) is small (e.g., less than 50), working with a parity check matrix according to the concepts herein can provide very fast analysis regarding the viability of source data with the erasures (e.g., faster than running a large erasure decoder on various erasure patterns).

Parity analysis logic of embodiments may operate to analyze the parity check matrix H in light of the observation that a pattern of L erasures can be tolerated by $\mathcal{C}'$ if and only if the corresponding L columns of H are linearly independent over $\mathbb{F}_q$. For example, assume a set I[B] of size L such that the columns of H picked by I are dependent over $\mathbb{F}_2$. Equivalently, there is a non-zero vector $c \in \mathbb{F}_2^B$ only supported on I such that Hc=0. Therefore, c is a valid codeword of $\mathcal{C}'$ which can be confused with the all-zeros codeword when the coordinate positions in I are erased. For the opposite direction, suppose there is a set I as above and two distinct codewords c, c′∈$\mathbb{F}_q^B$ in $\mathcal{C}'$ that can be confused when the positions in I are erased. That is, c and c′ agree on all positions outside I. Consider c″:=c−c′. Thus a non-zero c″ that is a codeword of $\mathcal{C}'$ (by linearity) may be found. By the definition of H, H c″=0, which exhibits a nontrivial linear dependence over the columns of H picked by I.

Using the above, the speed at which the analysis in the second step of the comprehensive analysis described above can also be significantly increased in light of only checking the rank of matrices of dimension Y×L (e.g., 100×4) as opposed to k×B (e.g, 1000×1100). Preferably, the number of rows in the matrix can use L′<Y rows, where L′ is slightly larger than L, to check with high probability where there are any linear dependencies, and if linear dependencies are found within a particular set of L columns, then additional rows can be considered to check to see if the linear dependency remains when all rows are considered instead of a subset of L′ rows.

Further performance improvements may be provided according to embodiments in light of the observation that, assuming all entries of H are either 0 or 1, a set of columns of H are linearly independent over $\mathbb{F}_q$ if and only if they are linearly independent over $\mathbb{F}_2$. In particular, if the set of columns are linearly independent over $\mathbb{F}_q$ they are also independent over $\mathbb{F}_2$. For the opposite direction, suppose the columns are $h_1, \ldots, h_L$ and exhibit a linear dependency $h_1 = \alpha_2 h_2 + \ldots + \alpha_L h_L$, where the $\alpha_i$ are over $\mathbb{F}_q$. Taking the trace of the above equality provides $h_1$=trace$(\alpha_1)h_2 + \ldots +$ trace$(\alpha_L)h_L$, which is a nontrivial linear dependence over $\mathbb{F}_2$. If $\mathcal{C}'$ is such that every encoded symbol of $\mathcal{C}'$ is a summation of some set of message symbols (that is, with coefficient 1), then it can be ensured that there is a choice of H consisting of only 0/1 entries. Thus, for such a code, the rank of submatrices of H over $\mathbb{F}_2$ may only be checked, which is significantly faster than the same problem over $\mathbb{F}_2$. Moreover, as a hashing technique, such as described below, can be used to further speed up the rank computations over $\mathbb{F}_2$.

In constructing a parity check matrix, H, as may be utilized by data integrity checking logic of embodiments, it should be appreciated that for a fixed $\mathcal{C}'$, there are many choices of G and H that are valid. A choice for G is valid if its rows define a basis for $\mathcal{C}'$ and a choice for H is valid if $GH^T=0$ for some valid choice of G and where the rank of H is maximal (if G and H both use binary coefficients, then we can use multiplication over $\mathbb{F}_2$ instead of $\mathbb{F}_q$). A valid choice for G is called systematic if there is a k×k submatrix of G that is (up to permutation of columns) the identity matrix. Such a G exists with the identity portion on a set I⊆[B](|I|=k) if and only if the code $\mathcal{C}'$ is full rank on the positions picked by I. For simplicity of notation, assume a choice for G of the form G=($I_k$|G′), where $I_k$ is the k×k identity matrix and G′ is some binary k×Y matrix. Then, it follows that H=(G′$^T$|$I_Y$) is a valid choice for H, and that $GH^T=0$. Accordingly, H is readily available if G is systematic and computing H reduces to computing a systematic G.

To compute a systematic G, a full rank set I⊆[B] of size k may be identified. Assuming $\mathcal{C}'$ is such that such configurations are abundant (e.g., RAPTORQ), any random I may be tried and, in the unlikely case of failure, retried with another random choice as necessary. Assuming without loss of generality that I={1; : : : ; k} is a full rank choice, the ith row of G′ may be constructed as follows:

Use the decoder of $\mathcal{C}'$ to decode $c_i$:=(0; 0; : : : ; 0; 1; 0; : : : ; 0; ?; : : : ; ?), where the 1 is at position i and the question marks are erasures starting at position k+1. If the decoder fails, restart with a new I. Otherwise, re-encode the resulting message, and the resulting codeword of $\mathcal{C}'$ would be the ith row of G′.

Hashing Analysis Logic

As another example of variations of the data integrity checking configurations which may be implemented according to the concepts herein, a data integrity checking configuration may utilize hashing analysis logic (e.g., logic of data integrity forward checking logic 256) which a hashing algorithm is utilized with respect to a parity check matrix (e.g., generated as described above) having all binary entries to optimize the pattern-checking operation. Accordingly, such a hashing analysis may provide efficient determinations that the code can withstand certain storage node loss events without data loss for special cases (e.g., binary parity check matrices) of the parity analysis logic.

In an embodiment of a hashing analysis technique, it is assumed that all entries of H are either 0 or 1. Checking erasure tolerance of $C'$ via H according to embodiments still includes checking $O(B^L)$ erasure patterns, however each pattern would involve checking a very small matrix (e.g., 100×4). An additional advantage of using His that the running time of the pattern-checking step may be reduced from $O(B^L)$ to $O(\sqrt{B^L})$.

It should be borne in mind that a goal is to determine whether there is a non-empty set $I\subseteq[B]$ of at most L such that the XOR of the corresponding columns of H equals the zero vector. A standard hash table (using a standard universal hashing data structure, such as Python's dictionaries) may be used to speed up this process according to embodiments.

Assume L is even. In operation of a hashing analysis technique of embodiments, every set of at most L/2 columns of H are considered. For each set, embodiments compute the XOR of the corresponding columns, and store the resulting XOR in the hash table. If the XOR that is to be stored is already in the dictionary, a linear dependence of size at most L exists between the columns of H, thus indicating a bad erasure pattern. If, however, collisions never occur, the code $C'$ can tolerate every pattern of up to L erasures. Note that a collision would imply existence of two distinct sets I, $I'\subseteq[B]$, each of size at most L/2, such that the XOR of the columns of H picked by I is the same as the XOR of the columns of H picked by I'. Therefore, the XOR of some non-empty subset of columns in $I \cap I'$ would be zero, and that is a non-trivial linear dependence in H. For the opposite direction, suppose some set $I\subseteq[B]$ of size at most L exists such that the XOR of the columns of H picked by I is the zero vector. Arbitrarily partitioning L into sets $I_0$ and $I_1$ each of size at most L/2, the hashing analysis of embodiments may either check $I_0$ before $I_1$ or the other way around, and in any case, since the XOR of the columns of H picked by $I_0$ is equal to the XOR of the columns picked by $I_1$, a collision will be detected by the hashing analysis logic. As an example of operation of a hashing analysis technique of embodiments, every pattern of up to 4 erasures can be checked in overall time $O(B^2)$ as opposed to the $O(B^4 f(t))$ running time of the comprehensive analysis technique discussed above, where $f(B)$ is the rank computation time for matrices with $\approx B^2$ entries.

Combined Hashing and Group Analysis Logic

As a further example of variations of the data integrity checking configurations which may be implemented according to the concepts herein, a data integrity checking configuration may combine the above described hashing analysis with the above described group analysis to provide group hashing analysis logic (e.g., logic of data integrity forward checking logic 256) to further reduce the number of checks performed by the group analysis. Embodiments combining a hashing analysis technique and group analysis technique may, for example, reduce the number of checks from $O((B/r)^L)$ down to $O((B/r)^{L/2})$, where $r=(Y-x)/L$.

In an embodiment of a group hashing analysis technique, it is again assumed that all entries of H are either 0 or 1. In operation of a group hashing analysis technique of embodiments, a hashing technique (e.g., the above described hashing analysis technique) is run on groups (e.g., the groups of the above described group analysis technique) instead of columns. In particular, all groups of size L/2 may be enumerated, whereby each combination corresponds to a set of Lr/2 columns (instead of L/2 in the exemplary hashing embodiment described above). For each combination, the XOR of all subsets of the chosen Lr/2 columns may be added to the hash table. As before, there is a linear dependence between some set of L groups if and only if the analysis finds a collision. The total running time of embodiments of this variation is thus be proportional to $(B/r)^{L/2} 2^{Lr/2}$. It can be appreciated that, compared to the group analysis technique without hashing, a factor of $(B/r)^{L/2}$ is gained but a factor of $2^{Lr/2}$ is lost. However, it should be noted that each iteration of the hashing analysis technique would simply add some vector of length Y to a hash table, which is expected to consume appreciable less time than that consumed by rank computation by the group analysis technique described above. Therefore, to gain a significant advantage using embodiments of a group hashing analysis technique, the parameters are set up so that $2^{Lr/2} \ll (B/r)^{L/2}$, i.e., $r2^r < B$. For example, for B=1024, a choice of L=8 and r=4 may be tractable for checking a total of 32 failures.

Methods Applied to RAPTOR FEC Code

One example of a large erasure code to which the methods and embodiments described previously can be applied is the Raptor FEC code specified in IETF RFC 5053. The Raptor FEC code operates over the field $\mathbb{F}_2$, and thus the entries in both the generator matrix G and the parity matrix H are either 0 or 1. Thus, all the methods and embodiments described above can be directly applied when the Raptor FEC code is used:

Methods Applied to RAPTORQ FEC Code

One example of a large erasure code to which the methods and embodiments described previously can be applied is the RAPTORQ FEC code specified in IETF RFC 6330. The RAPTORQ FEC code nominally operates over the field $\mathbb{F}_{256}$, and thus the entries in both the generator matrix G and the parity matrix H are formally elements of $\mathbb{F}_{256}$. Thus, all the methods and embodiments described above for general fields $\mathbb{F}_q$ can be directly applied when the RAPTORQ FEC code is used, but some of the methods and embodiments described when operating over $\mathbb{F}_2$ are not directly applicable.

However, RAPTORQ FEC is "almost" over $\mathbb{F}_2$ in the sense described below, and thus the methods and embodiments described above that are applicable when using $\mathbb{F}_2$ can be adapted and modified to work with the RAPTORQ FEC code. The matrix G that can be used to produce encoding symbols from the Intermediate block has the property that it comprises B+w+h rows, where the first B rows correspond to rows over $\mathbb{F}_2$ to generate B encoded symbols, the next w rows correspond to check rows over $\mathbb{F}_2$ on the Intermediate block (and thus the corresponding encoded symbol values are known zero values), and the remaining h rows correspond to check rows over $\mathbb{F}_{256}$ (and thus the corresponding encoded symbol values are known zero values), where h is a relatively small value (ranging up to a value of 14 when the number of source symbols k ranges up to over 56,000). The last h rows of G are the only rows that are over $\mathbb{F}_{256}$ instead of $\mathbb{F}_2$. In this construction, at least k encoded symbols are needed to recover the Intermediate block, in addition to the w+h check equations. Checking decodability of an object from B fragments corresponds to checking decodability of the Intermediate block from the ESIs associated with the first B rows of G (corresponding to the B encoded symbols from which the B fragments are generated).

The methods and embodiments described above that are applicable when the field is $\mathbb{F}_{256}$ can be applied directly when using RAPTORQ, which is referred to as the $\mathbb{F}_{256}$ embodiment. For the $\mathbb{F}_{256}$ embodiment, subsets of k+x of the t ESIs can be checked for decodability, where x=2 for example ensures decodability with probability 99.9999%, and higher probability decodability can be achieve with slightly larger values of x, by using k+x of the first B equations (based on values of k+x encoded symbols), and the check equations associated with the remaining w+h rows (with known zero values).

The methods and embodiments described above that are applicable when the field is $\mathbb{F}_2$ can be applied when using RAPTORQ by the following alternative $\mathbb{F}_2$ embodiment. Consider the matrix G' which is obtained from G by removing the last h rows (which are the only ones that involve $\mathbb{F}_{256}$) from G. Then, decodability is determined using G' instead of G, using additional encoded symbols (e.g., at least h additional) beyond k to decode. Thus, subsets of k+h+x' of the B ESIs are used to see if the Intermediate block can be decoded based on G', where decoding is ensured with probability approximately $1-2^{-x'}$. Although the number of encoded symbols used to decode may be larger compared to k (h+x' larger than k for the alternative $\mathbb{F}_2$ embodiment compared to x larger than k for the $\mathbb{F}_{256}$ embodiment), the advantage is that the decoding based on G' is over $\mathbb{F}_2$. From this, one skilled in the art can see that all of the analysis logic described above that operates over $\mathbb{F}_2$ can be appropriately configured to operate with this alternative $\mathbb{F}_2$ embodiment of the RAPTORQ FEC code.

There are many advantages to the alternative $\mathbb{F}_2$ embodiment. For example, decoding can generally be performed faster over $\mathbb{F}_2$ than over $\mathbb{F}_{256}$, and thus, for example, the comprehensive analysis logic can run faster. As another example, the methods described above operating over $\mathbb{F}_2$ are directly applicable to the alternative $\mathbb{F}_2$ embodiment.

There are also variant embodiments of the above methods for the RAPTORQ FEC code. For example, the alternative $\mathbb{F}_2$ embodiment can be used for an initial analysis checking for decodability, and if potentially undecodable sets of groups of ESIs or sets of ESIs are found during the initial analysis checking, a more definitive analysis checking can be performed on these potentially undecodable sets of groups of ESIs or sets of ESIs using the $\mathbb{F}_{256}$ embodiment. The advantage of this variant embodiment is that the alternative $\mathbb{F}_2$ embodiment, for example when integrated into the combined hashing plus group analysis logic, can operate very quickly and produce a small list of potentially undecodable sets (filtering out the majority of the sets that are verified to be decodable using the alternative $\mathbb{F}_2$ embodiment integrated into the combined hashing plus group analysis logic), and then the $\mathbb{F}_{256}$ embodiment can be applied to the small list of potentially undecodable sets, which can run quickly since the list is small. Thus, overall the speed is much quicker than using just the $\mathbb{F}_{256}$ embodiment, but the verification reliability is equivalent to just using the more reliable $\mathbb{F}_{256}$ embodiment.

Figure 4:
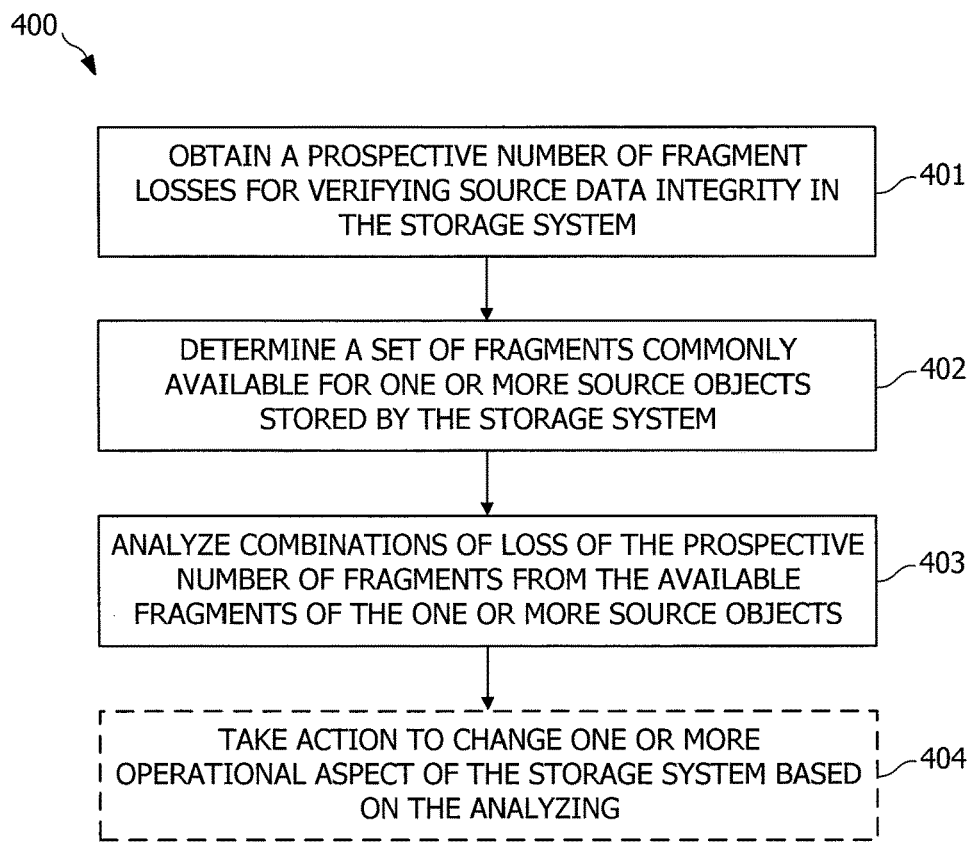
FIG. 4 shows a high level flow diagram of operation to provide verification of code resiliency according to embodiments of the present disclosure.

FIG. 4 shows an exemplary operational flow as may be implemented by embodiments in accordance with the present disclosure. In flow 400 of the illustrated embodiment, a prospective number of fragment losses for use in verifying source data integrity in the storage system is obtained at block 401. For example, a storage administrator, a user, a database manager, etc. may provide a number of fragment losses to be analyzed. Additionally or alternatively, a number of fragment losses may be computed for use in forward checking according to embodiments, such as based upon a storage node failure rate, a storage system reliability metric, etc.

At block 402 of the illustrated embodiment of flow 400, a set of erasure encoded fragments commonly available for one or more source objects stored by the storage system is determined for use in verifying the source data integrity. For example, a source object having the fewest number of available fragments may be identified (e.g., in certain large erasure code implementations, such as where fragments are stored on all of the storage nodes for each source object, the remaining available fragments for the source object having the fewest number of available fragments identifies a set of erasure encoded fragments which are commonly available for all source objects stored by the storage system) and the number of available fragments thereof determined. The source object having the fewest number of available fragments may be identified, for example, by its relative position in a repair queue, such as in embodiments implementing a lazy repair policy for repairing fragment losses. Additionally or alternatively, a number of fragments available for one or more source objects may be determined based upon system metrics, such as a number of fragments (k) used by the particular erasure code used and a number of fragments provided by a minimum redundancy metric (Y).

In operation of a group analysis embodiment, the set of available erasure encoded fragments may be logically portioned into groups at block 402. For example, the set of available fragments (e.g., B=k+Y fragments) may be partitioned into some number, g, of groups.

At block 403 of flow 400 illustrated in FIG. 4, combinations of losses of the prospective number of fragments from the available fragments for the one or more source objects are analyzed. For example, embodiments may utilize comprehensive analysis, group analysis, parity analysis, hashing analysis, and/or combinations thereof (examples of which have been described in detail above) to determine if the combinations of losses of the prospective numbers of fragments continue to allow for the decoding of the source data of the one or more source objects.

A group analysis embodiment may operate at block 403 to analyze a plurality of combinations of loss of the prospective number of groups of fragments from the available number of erasure coded fragments to verify data integrity in the storage system. In analyzing such groups of fragments according to embodiments, it is determined whether the storage system is susceptible to source data loss due to a loss of L groups of erasure coded fragments.

Irrespective of the particular data integrity checking analysis utilized, embodiments may operate to utilize the results of the analysis in a number of ways. For example, embodiments may utilize the results to conclude that the source objects most at risk (e.g., the source objects having the fewest available fragments) are not in imminent risk of loss of data (e.g., the source data remains recoverable even after loss of a particular number of additional fragments). In operation according to embodiments, where it is determined that the source objects continue to be decodable with the particular number of storage node losses analyzed, embodiments may operate to report this conclusion and allow continued operation of the storage system without alteration. Embodiments may, however, take one or more actions based upon the analysis of the combinations of loss of the prospective number of fragments (e.g., in response to a conclusion that the source objects continue to be decodable with the particular number of storage node losses analyzed and/or in response to a conclusion that the source objects are not decodable with the particular number of storage node losses), as shown by optional block 404 of the illustrated embodiment of flow 400.

For example, embodiments may operate to perform further data integrity forward checking analysis upon a conclusion that the source objects continue to be decodable, such as using incrementally larger number(s) of storage node losses to determine a number of storage node losses at which source data is at risk. Such information may be utilized according to embodiments to alter one or more attributes of the storage system operation, such as to decrease the repair bandwidth used by the repair policy, decrease the minimum redundancy maintained by the system, etc.

Embodiments of a generic verification of coding resiliency process may include GenTemplate generating a plurality of lists of template decode test subsets corresponding to different values of input parameters k, Y, x, and L (and thus A=k+x, B=k+Y). For example, k=1000 may be used to store all source objects in a storage system, and there may be a target value of having Y=100 fragments beyond k available for each object stored in the system, but nevertheless there may be times when the number of available fragments available for at least some source objects is less than 1100. Thus, GenTemplate may generate lists of template decode test subsets for k+Y=1100, k+Y=1080, k+Y=1050, and then MapTemplateToSpecific and CheckSpecific use the appropriate template depending on how many available fragments there are at the time of checking decodability of a specific set of ESIs S. These methods can be used by generic verification of coding resiliency using comprehensive analysis logic, group analysis logic, or covering based group analysis logic, as examples. These methods can also be used by parity analysis logic methods, hashing analysis logic methods, or combined hashing and group analysis logic methods, as examples.

For embodiments of generic verification of coding resiliency, the number of decode test subsets to check is generally smaller for smaller values of L, and thus the execution time of MapTemplateToSpecific and CheckSpecific is generally much faster for smaller values of L, whereas the urgency of repair is higher if the test fails for smaller values of L. Thus, GenTemplate may generate lists of template decode test subsets for L=1, L=2, L=3, etc., and then MapTemplateToSpecific and CheckSpecific are quickly executed for a list of template decode test subsets generated by GenTemplate from input L=1, and if the test fails then emergency repair can commence quickly for the objects for which the test failed. Also, MapTemplateToSpecific and CheckSpecific can executed for lists of template decode test subsets generated by GenTemplate from input L=2, 3, 4, etc., and if the test fails then emergency repair can commence for the objects for which the test fails at a rate appropriate to the value of L and the more detailed results of the output of CheckSpecific for each value of L. MapTemplateToSpecific and CheckSpecific can be executed sequentially or concurrently for different values of L. The emergency repair response to results of the output of CheckSpecific may be initiated before CheckSpecific has completed checking for decodability for one of more of the lists of template decode test subsets. These methods can be used by generic verification of coding resiliency using comprehensive analysis logic, group analysis logic, or covering based group analysis logic, as examples. These methods can also be used by parity analysis logic methods, hashing analysis logic methods, or combined hashing and group analysis logic methods, as examples.

As a further example, the level of emergency repair response may depend on the detailed results of the verification of coding resiliency. For example, the emergency repair response to a verification of coding resiliency test for a set of ESIs S may depend on the number of S-specific decode test subsets for which the decoding test fails (e.g., if no tests fail then repair continues without an emergency response, if a few tests fail then the emergency response may be a mild increase in repair bandwidth usage, if a lot of test fails then the emergency response may be a substantial increase in repair bandwidth usage).

As still a further example, embodiments may operate in response to a conclusion that the source objects may not be decodable in the future to implement immediate repair processing with respect to the source object(s) with the fewest available fragments. Similarly, embodiments may operate to place particular source objects higher in a repair queue in order to expedite their repair processing in light of the data integrity checking analysis. In operation according to embodiments, one or more operational attributes of the storage system in response to a conclusion that source objects may not be decodable in the future with the particular number of future storage node losses analyzed. For example, a parameter of the repair policy, such as the repair bandwidth used by the repair policy and/or minimum redundancy maintained by the repair policy, may be dynamically changed in view of the data integrity checking determination.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method implemented by processor-based logic of a storage system storing source objects as a plurality of erasure coded fragments, the method comprising:
   obtaining, by the logic of the storage system, a prospective number of fragment losses (L) for verifying source data integrity with respect to the storage system;
   determining, by the logic of the storage system for a plurality of data storage patterns used to store the source data, a set of available erasure coded fragments for a first source object of a plurality of source objects stored by the storage system that are available in common with a set of available erasure coded fragments for a second source object of the plurality of source objects; and
   analyzing, by the logic of the storage system, a plurality of combinations of loss of the prospective number of fragments from the available set of erasure coded fragments for the first source object to verify data integrity in the storage system, whereby it is determined whether the storage system is susceptible to source data loss due to a loss of L erasure coded fragments, wherein the analyzing the plurality of combinations of loss of the prospective number of fragments for a data storage pattern of the plurality of data storage patterns comprises:

determining whether a source object stored using the data storage pattern remains decodable when L erasure coded fragments are lost; and if it is determined that the source object does not remain decodable when L erasure coded fragments are lost,
expediting repair processing of fragments stored using the data storage pattern; and
slowing repair processing of fragments stored using other data storage patterns of the plurality of data storage patterns.

2. The method of claim 1, wherein the available set of erasure coded fragments for the first source object comprises available fragments for a source object having a fewest number of erasure coded fragments remaining available within the storage system.

3. The method of claim 1, wherein a size of the available set of erasure coded fragments for the first source object comprises a number of source fragments used by the erasure code (k) plus a number of minimum redundancy fragments (Y) stored by the storage system.

4. The method of claim 3, whereby it is determined whether a source object with k+Y available erasure coded fragments available remains decodable when any L erasure coded fragments are lost.

5. The method of claim 1, wherein an erasure code used to provide the plurality of erasure coded fragments comprises a large erasure code, and wherein one erasure coded fragment of the erasure coded fragments for each source object of the plurality of source objects is stored on a different storage node of a plurality of storage nodes of the storage system.

6. The method of claim 5, wherein a fragment is available for a source object if the storage node at which the fragment is stored is operational.

7. The method of claim 1, wherein an erasure code used to provide the plurality of erasure coded fragments comprises an erasure code that is not a maximum distance separable (MDS) erasure code.

8. The method of claim 1, wherein the analyzing the plurality of combinations of loss of the prospective number of fragments comprises:

analyzing all combinations of loss of L erasure coded fragments from the available set of erasure coded fragments for the first source object.

9. The method of claim 8, wherein a number of source fragments used by an erasure code providing the erasure coded fragments is k, and wherein the analyzing all combinations of the loss of L erasure coded fragments comprises:

constructing a generator matrix from elementary basis vector codewords arranged as rows of the matrix;
removing each combination of L columns of the generator matrix to obtain a rank of every sub-matrix of the generator matrix; and
determining if columns having L columns removed have rank at least k.

10. The method of claim 1, wherein the analyzing the plurality of combinations of loss of the prospective number of fragments comprises:

partitioning the available set of erasure coded fragments for the first source object into a number of groups (g) of erasure coded fragments; and
analyzing a plurality of sets (S) of the groups of erasure coded fragments.

11. The method of claim 10, wherein each set (S) of the plurality of sets comprises g-L groups of coded fragments.

12. The method of claim 10, wherein a number of source fragments used by an erasure code providing the erasure coded fragments is k, wherein each set (S) is of k to k+x erasure coded fragments, wherein x<Y, and wherein Y is a number of minimum redundancy fragments stored by the storage system.

13. The method of claim 10, wherein groups of erasure encoded fragments of the g groups of erasure coded fragments are chosen based on a covering design with parameters g, L, and L', wherein L'>L and a size of a union of any g-L' groups of the chosen groups of erasure encoded fragments is at least k+x, wherein k is a number of source fragments used by the erasure code and x is an additional number of fragments used to increase recovery reliability.

14. The method of claim 1, wherein the analyzing the plurality of combinations of loss of the prospective number of fragments comprises:

constructing a parity check matrix for codeword analysis of the loss of the prospective number of fragments; and
analyzing codeword weight for the parity check matrix to determine an inability to decode source data when the prospective number of fragments are lost.

15. The method of claim 1, wherein the analyzing the plurality of combinations of loss of the prospective number of fragments comprises:

constructing a hash table for analysis of the loss of the prospective number of fragments; and
analyzing the hash table to determine if a linear dependence exists between columns of the hash table to determine an inability to decode source data when the prospective number of fragments are lost.

16. The method of claim 1, further comprising:

taking action, by the logic of the storage system, to change at least one operational parameter of the storage system in response to the analyzing.

17. The method of claim 16, wherein the taking action comprises:

taking action in response to a conclusion that the one or more source objects continue to be decodable with prospective number of fragment losses analyzed.

18. The method of claim 17, wherein the taking action comprises:

decreasing a repair bandwidth used by a repair policy of the storage system.

19. The method of claim 17, wherein the taking action comprises:

decreasing a minimum redundancy maintained by the storage system.

20. The method of claim 16, wherein the taking action comprises:

taking action in response to a conclusion that the plurality of source objects will not be decodable with prospective number of fragment losses analyzed.

21. The method of claim 20, wherein the taking action comprises:

implementing immediate repair processing with respect to the plurality of source objects.

22. The method of claim 20, wherein the taking action comprises:

placing one or more source objects higher in a repair queue in order to expedite repair processing for the one or more source objects in light of analyzing.

23. The method of claim 20, wherein the taking action comprises:
increasing a repair bandwidth used by a repair policy of the storage system.

24. The method of claim 20, wherein the taking action comprises:
increasing a minimum redundancy maintained by the storage system.

25. The method of claim 1, wherein the analyzing the plurality of combinations of loss of the prospective number of fragments comprises:
determining whether a source object remains decodable when L erasure coded fragments are lost; and
if it is determined that the source object does not remain decodable when L erasure coded fragments are lost, repartitioning of the L erasure coded fragments; and
determining whether the source object remains decodable when the repartitioned L erasure coded fragments are lost.

26. The method of claim 1 wherein the plurality of data storage patterns comprise a plurality of encoded symbol ID (ESI) patterns.

27. An apparatus for analyzing source objects stored by a storage system as a plurality of erasure coded fragments, the apparatus comprising:
one or more data processors; and
one or more non-transitory computer-readable storage media containing program code configured to cause the one or more data processors to perform operations including:
obtaining a prospective number of fragment losses (L) for verifying source data integrity with respect to the storage system;
determining, for a plurality of data storage patterns used to store the source data, a set of available erasure coded fragments for a first source object of a plurality of source objects stored by the storage system that are available in common with a set of available erasure coded fragments for a second source object of the plurality of source objects; and
analyzing a plurality of combinations of loss of the prospective number of fragments from the available set of erasure coded fragments for the first source object to verify data integrity in the storage system, whereby it is determined whether the storage system is susceptible to source data loss due to a loss of L erasure coded fragments, wherein the analyzing the plurality of combinations of loss of the prospective number of fragments for a data storage pattern of the plurality of data storage patterns comprises:
determining whether a source object stored using the data storage pattern remains decodable when L erasure coded fragments are lost; and
if it is determined that the source object does not remain decodable when L erasure coded fragments are lost,
expediting repair processing of fragments stored using the data storage pattern; and
slowing repair processing of fragments stored using other data storage patterns of the plurality of data storage patterns.

28. The apparatus of claim 27, wherein the available set of erasure coded fragments for the first source object comprises available fragments for a source object having a fewest number of erasure coded fragments remaining available within the storage system.

29. The apparatus of claim 27, wherein a size of the available set of erasure coded fragments for the first source object comprises a number of source fragments used by the erasure code (k) plus a number of minimum redundancy fragments (Y) stored by the storage system.

30. The apparatus of claim 29, whereby it is determined whether a source object with k+Y available erasure coded fragments available remains decodable when any L erasure coded fragments are lost.

31. The apparatus of claim 27, wherein an erasure code used to provide the plurality of erasure coded fragments comprises a large erasure code, and wherein one erasure coded fragment of the erasure coded fragments for each source object of the plurality of source objects is stored on a different storage node of a plurality of storage nodes of the storage system.

32. The apparatus of claim 31, wherein a fragment is available for a source object if the storage node at which the fragment is stored is operational.

33. The apparatus of claim 27, wherein an erasure code used to provide the plurality of erasure coded fragments comprises an erasure code that is not a maximum distance separable (MDS) erasure code.

34. The apparatus of claim 27, wherein the analyzing the plurality of combinations of loss of the prospective number of fragments comprises:
analyzing all combinations of loss of L erasure coded fragments from the available set of erasure coded fragments for the first source object.

35. The apparatus of claim 34, wherein a number of source fragments used by an erasure code providing the erasure coded fragments is k, and wherein the analyzing all combinations of the loss of L erasure coded fragments comprises:
constructing a generator matrix from elementary basis vector codewords arranged as rows of the matrix;
removing each combination of L columns of the generator matrix to obtain a rank of every sub-matrix of the generator matrix; and
determining if columns having L columns removed have rank at least k.

36. The apparatus of claim 27, wherein the analyzing the plurality of combinations of loss of the prospective number of fragments comprises:
partitioning the available set of erasure coded fragments for the first source object into a number of groups (g) of erasure coded fragments; and
analyzing a plurality of sets (S) of the groups of erasure coded fragments.

37. The apparatus of claim 36, wherein each set (S) of the plurality of sets comprises g-L groups of coded fragments.

38. The apparatus of claim 36, wherein a number of source fragments used by an erasure code providing the erasure coded fragments is k, wherein each set (S) is of k to k+x erasure coded fragments, wherein x<Y, and wherein Y is a number of minimum redundancy fragments stored by the storage system.

39. The apparatus of claim 36, wherein groups of erasure encoded fragments of the g groups of erasure coded fragments are chosen based on a covering design with parameters g, L, and L', wherein L'>L and a size of a union of any g-L' groups of the chosen groups of erasure encoded fragments is at least k+x, wherein k is a number of source fragments used by the erasure code and x is an additional number of fragments used to increase recovery reliability.

40. The apparatus of claim 27, wherein the analyzing the plurality of combinations of loss of the prospective number of fragments comprises:
constructing a parity check matrix for codeword analysis of the loss of the prospective number of fragments; and
analyzing codeword weight for the parity check matrix to determine an inability to decode source data when the prospective number of fragments are lost.

41. The apparatus of claim 27, wherein the analyzing the plurality of combinations of loss of the prospective number of fragments comprises:
constructing a hash table for analysis of the loss of the prospective number of fragments; and
analyzing the hash table to determine if a linear dependence exists between columns of the hash table to determine an inability to decode source data when the prospective number of fragments are lost.

42. The apparatus of claim 27, wherein the operations performed by the one or more data processors further includes:
taking action to change at least one operational parameter of the storage system in response to the analyzing.

43. The apparatus of claim 42, wherein the taking action comprises:
taking action in response to a conclusion that the one or more source objects continue to be decodable with prospective number of fragment losses analyzed.

44. The apparatus of claim 43, wherein the taking action comprises:
decreasing a repair bandwidth used by a repair policy of the storage system.

45. The apparatus of claim 43, wherein the taking action comprises:
decreasing a minimum redundancy maintained by the storage system.

46. The apparatus of claim 42, wherein the taking action comprises:
taking action in response to a conclusion that the plurality of source objects will not be decodable with prospective number of fragment losses analyzed.

47. The apparatus of claim 46, wherein the taking action comprises:
implementing immediate repair processing with respect to the plurality of source objects.

48. The apparatus of claim 46, wherein the taking action comprises:
placing one or more source objects higher in a repair queue in order to expedite repair processing for the one or more source objects in light of analyzing.

49. The apparatus of claim 46, wherein the taking action comprises:
increasing a repair bandwidth used by a repair policy of the storage system.

50. The apparatus of claim 46, wherein the taking action comprises:
increasing a minimum redundancy maintained by the storage system.

51. The apparatus of claim 27, wherein the analyzing the plurality of combinations of loss of the prospective number of fragments comprises:
determining whether a source object remains decodable when L erasure coded fragments are lost; and
if it is determined that the source object does not remain decodable when L erasure coded fragments are lost, repartitioning of the L erasure coded fragments; and
determining whether the source object remains decodable when the repartitioned L erasure coded fragments are lost.

52. The apparatus of claim 27, wherein the plurality of data storage patterns comprise a plurality of encoded symbol ID (ESI) patterns.

53. An apparatus for analyzing source objects stored by a storage system as a plurality of erasure coded fragments, the apparatus comprising:
means for obtaining a prospective number of fragment losses (L) for verifying source data integrity with respect to the storage system;
means for determining, for a plurality of data storage patterns used to store the source data, a set of available erasure coded fragments for a first source object of a plurality of source objects stored by the storage system that are available in common with a set of available erasure coded fragments for a second source object of the plurality of source objects; and
means for analyzing a plurality of combinations of loss of the prospective number of fragments from the available set of erasure coded fragments for the first source object to verify data integrity in the storage system, whereby it is determined whether the storage system is susceptible to source data loss due to a loss of L erasure coded fragments, wherein the means for analyzing the plurality of combinations of loss of the prospective number of fragments for a data storage pattern of the plurality of data storage patterns comprises:
means for determining whether a source object stored using the data storage pattern remains decodable when L erasure coded fragments are lost; and
means expediting repair processing of fragments stored using the data storage pattern if it is determined that the source object does not remain decodable when L erasure coded fragments are lost; and
means for slowing repair processing of fragments stored using other data storage patterns of the plurality of data storage patterns if it is determined that the source object does not remain decodable when L erasure coded fragments are lost.

54. The apparatus of claim 53 wherein an erasure code used to provide the plurality of erasure coded fragments comprises a large erasure code, and wherein one erasure coded fragment of the erasure coded fragments for each source object of the plurality of source objects is stored on a different storage node of a plurality of storage nodes of the storage system.

55. The apparatus of claim 54, wherein a fragment is available for a source object if the storage node at which the fragment is stored is operational.

56. The apparatus of claim 53, wherein an erasure code used to provide the plurality of erasure coded fragments comprises an erasure code that is not a maximum distance separable (MDS) erasure code.

57. The apparatus of claim 53, wherein the means for analyzing the plurality of combinations of loss of the prospective number of fragments comprises:
means for analyzing all combinations of loss of L erasure coded fragments from the available set of erasure coded fragments for the first source object.

58. The apparatus of claim 53, wherein the means for analyzing the plurality of combinations of loss of the prospective number of fragments comprises:
means for partitioning the available erasure coded fragments for the first source object into a number of groups (g) of erasure coded fragments; and means for analyzing a plurality of sets (S) of the groups of erasure coded fragments.

59. The apparatus of claim 58, wherein groups of erasure encoded fragments of the g groups of erasure coded fragments are chosen based on a covering design with parameters g, L, and L', wherein L'>L and a size of a union of any g-L' groups of the chosen groups of erasure encoded fragments is at least k+x, wherein k is a number of source fragments used by the erasure code and x is an additional number of fragments used to increase recovery reliability.

60. The apparatus of claim 53, wherein the means for analyzing the plurality of combinations of loss of the prospective number of fragments comprises:
  means for constructing a parity check matrix for codeword analysis of the loss of the prospective number of fragments; and
  means for analyzing codeword weight for the parity check matrix to determine an inability to decode source data when the prospective number of fragments are lost.

61. The apparatus of claim 53, wherein the means for analyzing the plurality of combinations of loss of the prospective number of fragments comprises:
  means for constructing a hash table for analysis of the loss of the prospective number of fragments; and
  means for analyzing the hash table to determine if a linear dependence exists between columns of the hash table to determine an inability to decode source data when the prospective number of fragments are lost.

62. The apparatus of claim 53, further comprising:
  means for taking action to change at least one operational parameter of the storage system in response to the analyzing.

63. The apparatus of claim 62, wherein the means for taking action comprises:
  means for decreasing a repair bandwidth used by a repair policy of the storage system when the means for analyzing concludes that the plurality source objects continue to be decodable with prospective number of fragment losses analyzed; and
  means for increasing the repair bandwidth used by the repair policy of the storage system when the analyzing concludes that the plurality source objects will not be decodable with prospective number of fragment losses analyzed.

64. The apparatus of claim 62, wherein the means for taking action comprises:
  means for decreasing a minimum redundancy maintained by the storage system when the means for analyzing concludes that the plurality source objects continue to be decodable with prospective number of fragment losses analyzed; and
  means for increasing the minimum redundancy maintained by the storage system when the analyzing concludes that the plurality source objects will not be decodable with prospective number of fragment losses analyzed.

65. The apparatus of claim 62, wherein the means for taking action comprises:
  means for implementing immediate repair processing with respect to one or more source objects of the plurality of source objects when the analyzing concludes that the plurality source objects will not be decodable with prospective number of fragment losses analyzed.

66. The apparatus of claim 62, wherein the means for taking action comprises:

means for placing one or more source objects higher in a repair queue in order to expedite repair processing for the one or more source objects in light of analyzing.

67. The apparatus of claim 53, wherein the means for analyzing the plurality of combinations of loss of the prospective number of fragments comprises:
  means for determining whether a source object remains decodable when L erasure coded fragments are lost; and
  means for repartitioning of the L erasure coded fragments and determining whether the source object remains decodable when the repartitioned L erasure coded fragments are lost, if it is determined that the source object does not remain decodable when L erasure coded fragments are lost.

68. The apparatus of claim 53, wherein the plurality of data storage patterns comprise a plurality of encoded symbol ID (ESI) patterns.

69. A non-transitory computer-readable medium comprising codes for analyzing source objects stored by a storage system as a plurality of erasure coded fragments, the codes causing a computer to:
  obtain a prospective number of fragment losses (L) for verifying source data integrity with respect to the storage system;
  determine a set of available erasure coded fragments for a first source object of a plurality of source objects stored by the storage system that are available in common with a set of available erasure coded fragments for a second source object of the plurality of source objects; and
  analyze a plurality of combinations of loss of the prospective number of fragments from the available set of erasure coded fragments for the first source object to verify data integrity in the storage system, whereby it is determined whether the storage system is susceptible to source data loss due to a loss of L erasure coded fragments, wherein the codes causing the computer to analyze the plurality of combinations of loss of the prospective number of fragments for a data storage pattern of the plurality of data storage patterns cause the computer to:
    determine whether a source object stored using the data storage pattern remains decodable when L erasure coded fragments are lost; and
    if it is determined that the source object does not remain decodable when L erasure coded fragments are lost to, expedite repair processing of fragments stored using the data storage pattern; and
    slow repair processing of fragments stored using other data storage patterns of the plurality of data storage patterns.

70. The non-transitory computer-readable medium of claim 69, wherein an erasure code used to provide the plurality of erasure coded fragments comprises a large erasure code, and wherein one erasure coded fragment of the erasure coded fragments for each source object of the plurality of source objects is stored on a different storage node of a plurality of storage nodes of the storage system.

71. The non-transitory computer-readable medium of claim 70, wherein a fragment is available for a source object if the storage node at which the fragment is stored is operational.

72. The non-transitory computer-readable medium of claim 69, wherein an erasure code used to provide the plurality of erasure coded fragments comprises an erasure code that is not a maximum distance separable (MDS) erasure code.

73. The non-transitory computer-readable medium of claim 69, wherein the codes causing the computer to analyze the plurality of combinations of loss of the prospective number of fragments comprise codes to cause the computer to:
- determine whether a source object remains decodable when L erasure coded fragments are lost; and
- repartition the L erasure coded fragments and determine whether the source object remains decodable when the repartitioned L erasure coded fragments are lost, if it is determined that the source object does not remain decodable when L erasure coded fragments are lost.

74. The non-transitory computer-readable medium of claim 69, wherein the plurality of data storage patterns comprise a plurality of encoded symbol ID (ESI) patterns.

* * * * *